(12) United States Patent
Butail et al.

(10) Patent No.: US 11,549,175 B2
(45) Date of Patent: Jan. 10, 2023

(54) METHOD OF DEPOSITING TUNGSTEN AND OTHER METALS IN 3D NAND STRUCTURES

(71) Applicant: Lam Research Corporation, Fremont, CA (US)

(72) Inventors: Gorun Butail, Fremont, CA (US); Joshua Collins, Sunnyvale, CA (US); Hanna Bamnolker, Cupertino, CA (US); Seshasayee Varadarajan, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/250,014

(22) PCT Filed: May 3, 2019

(86) PCT No.: PCT/US2019/030712
§ 371 (c)(1),
(2) Date: Nov. 2, 2020

(87) PCT Pub. No.: WO2019/213604
PCT Pub. Date: Nov. 7, 2019

(65) Prior Publication Data
US 2021/0238736 A1 Aug. 5, 2021

Related U.S. Application Data

(60) Provisional application No. 62/666,588, filed on May 3, 2018.

(51) Int. Cl.
*C23C 16/04* (2006.01)
*C23C 16/02* (2006.01)
(Continued)

(52) U.S. Cl.
CPC ............ *C23C 16/045* (2013.01); *C23C 16/02* (2013.01); *C23C 16/14* (2013.01); *C23C 16/45527* (2013.01)

(58) Field of Classification Search
CPC ....... C23C 16/045; C23C 16/02; C23C 16/14; C23C 16/45527
See application file for complete search history.

(56) References Cited

U.S. PATENT DOCUMENTS 4,746,375 A 5/1988 Iacovangelo
4,804,560 A 2/1989 Shioya et al.
(Continued)

FOREIGN PATENT DOCUMENTS

CN 101154576 A 4/2008
CN 101308794 A 11/2008
(Continued)

OTHER PUBLICATIONS

Lim, Booyong S., et al., "Atomic layer deposition of transition metals". Nature Materials, vol. 2, Nov. 2003, pp. 749-754.*
(Continued)

*Primary Examiner* — Bret P Chen
(74) *Attorney, Agent, or Firm* — Weaver Austin Villineuve & Sampson LLP

(57) ABSTRACT

Provided herein are methods and apparatuses for filling features metal-containing materials. One aspect of the disclosure relates to a method for filling structures with a metal-containing material, the method including: providing a structure to be filled with a metal-containing material, exposing the structure to multiple deposition cycles, with each deposition cycle including exposure to one or more alternating reducing agent (e.g. hydrogen (H2)) dose/inert gas purge pulses pulse followed by exposure to one or more alternating metal precursor dose pulses and inert gas purge
(Continued)

pulses. The metal may be tungsten (W) or molybdenum (Mo) in some embodiments. In some embodiments, the structure is a partially fabricated (3-D) NAND structure. Apparatuses to perform the methods are also provided.

22 Claims, 17 Drawing Sheets

(51) Int. Cl.
*C23C 16/14* (2006.01)
*C23C 16/455* (2006.01)

(56) References Cited

U.S. PATENT DOCUMENTS

| | | | |
|---|---|---|---|
| 4,874,719 | A | 10/1989 | Kurosawa |
| 4,962,063 | A | 10/1990 | Maydan et al. |
| 5,028,565 | A | 7/1991 | Chang et al. |
| 5,227,329 | A | 7/1993 | Kobayashi et al. |
| 5,250,329 | A | 10/1993 | Miracky et al. |
| 5,250,467 | A | 10/1993 | Somekh et al. |
| 5,308,655 | A | 5/1994 | Eichman et al. |
| 5,326,723 | A | 7/1994 | Petro et al. |
| 5,370,739 | A | 12/1994 | Foster et al. |
| 5,391,394 | A | 2/1995 | Hansen |
| 5,502,005 | A | 3/1996 | Mikagi |
| 5,567,583 | A | 10/1996 | Wang et al. |
| 5,633,604 | A | 5/1997 | Hu |
| 5,643,394 | A | 7/1997 | Maydan et al. |
| 5,661,080 | A | 8/1997 | Hwang et al. |
| 5,726,096 | A | 3/1998 | Jung |
| 5,795,824 | A | 8/1998 | Hancock |
| 5,804,249 | A | 9/1998 | Sukharev et al. |
| 5,817,576 | A | 10/1998 | Tseng et al. |
| 5,833,817 | A | 11/1998 | Tsai et al. |
| 5,913,145 | A | 6/1999 | Lu et al. |
| 5,916,634 | A | 6/1999 | Fleming et al. |
| 5,926,720 | A | 7/1999 | Zhao et al. |
| 5,956,609 | A | 9/1999 | Lee et al. |
| 5,963,833 | A | 10/1999 | Thakur |
| 5,994,749 | A | 11/1999 | Oda |
| 6,001,729 | A | 12/1999 | Shinriki et al. |
| 6,017,818 | A | 1/2000 | Lu |
| 6,034,419 | A | 3/2000 | Nicholls et al. |
| 6,037,263 | A | 3/2000 | Chang |
| 6,066,366 | A | 5/2000 | Berenbaum et al. |
| 6,099,904 | A | 8/2000 | Mak et al. |
| 6,103,609 | A | 8/2000 | Lee et al. |
| 6,107,200 | A | 8/2000 | Takagi et al. |
| 6,143,082 | A | 11/2000 | McInerney et al. |
| 6,174,812 | B1 | 1/2001 | Hsiung et al. |
| 6,206,967 | B1 | 3/2001 | Mak et al. |
| 6,245,654 | B1 | 6/2001 | Shih et al. |
| 6,260,266 | B1 | 7/2001 | Tamaki |
| 6,265,312 | B1 | 7/2001 | Sidhwa et al. |
| 6,277,744 | B1 | 8/2001 | Yuan et al. |
| 6,284,316 | B1 | 9/2001 | Sandhu et al. |
| 6,287,965 | B1 | 9/2001 | Kang et al. |
| 6,294,468 | B1 | 9/2001 | Gould-Choquette et al. |
| 6,297,152 | B1 | 10/2001 | Itoh et al. |
| 6,306,211 | B1 | 10/2001 | Takahashi et al. |
| 6,306,216 | B1 | 10/2001 | Kim, II et al. |
| 6,309,964 | B1 | 10/2001 | Tsai et al. |
| 6,309,966 | B1 | 10/2001 | Govindarajan et al. |
| 6,310,300 | B1 | 10/2001 | Cooney, III et al. |
| 6,340,629 | B1 | 1/2002 | Yeo et al. |
| 6,355,558 | B1 | 3/2002 | Dixit et al. |
| 6,359,160 | B1 | 3/2002 | Sun et al. |
| 6,404,054 | B1 | 6/2002 | Oh et al. |
| 6,429,126 | B1 | 8/2002 | Herner et al. |
| 6,465,347 | B2 | 10/2002 | Ishizuka et al. |
| 6,491,978 | B1 | 12/2002 | Kalyanam |
| 6,551,929 | B1 | 4/2003 | Kori et al. |
| 6,566,250 | B1 | 5/2003 | Tu et al. |
| 6,566,262 | B1 | 5/2003 | Rissman et al. |
| 6,581,258 | B2 | 6/2003 | Yoneda et al. |
| 6,593,233 | B1 | 7/2003 | Miyazaki et al. |
| 6,607,976 | B2 | 8/2003 | Chen et al. |
| 6,635,965 | B1 | 10/2003 | Lee et al. |
| 6,706,625 | B1 | 3/2004 | Sudijono et al. |
| 6,720,261 | B1 | 4/2004 | Anderson et al. |
| 6,740,585 | B2 | 5/2004 | Yoon et al. |
| 6,777,331 | B2 | 8/2004 | Nguyen |
| 6,794,287 | B2 * | 9/2004 | Saanila ............ H01L 21/76877 438/674 |
| 6,797,340 | B2 | 9/2004 | Fang et al. |
| 6,844,258 | B1 | 1/2005 | Fair et al. |
| 6,861,356 | B2 | 3/2005 | Matsuse et al. |
| 6,902,763 | B1 | 6/2005 | Elers et al. |
| 6,903,016 | B2 | 6/2005 | Cohen |
| 6,905,543 | B1 | 6/2005 | Fair et al. |
| 6,908,848 | B2 | 6/2005 | Koo |
| 6,936,538 | B2 | 8/2005 | Byun |
| 6,939,804 | B2 | 9/2005 | Lai et al. |
| 6,958,174 | B1 | 10/2005 | Klaus et al. |
| 6,962,873 | B1 | 11/2005 | Park |
| 7,005,372 | B2 | 2/2006 | Levy et al. |
| 7,141,494 | B2 | 11/2006 | Lee et al. |
| 7,157,798 | B1 | 1/2007 | Fair et al. |
| 7,211,144 | B2 | 5/2007 | Lu et al. |
| 7,220,671 | B2 | 5/2007 | Simka et al. |
| 7,235,486 | B2 | 6/2007 | Kori et al. |
| 7,262,125 | B2 | 8/2007 | Wongsenakhum et al. |
| 7,338,900 | B2 | 3/2008 | Mizuno et al. |
| 7,355,254 | B2 | 4/2008 | Datta et al. |
| 7,405,158 | B2 | 7/2008 | Lai et al. |
| 7,416,979 | B2 | 8/2008 | Yoon et al. |
| 7,419,904 | B2 | 9/2008 | Kato |
| 7,429,402 | B2 | 9/2008 | Gandikota et al. |
| 7,465,665 | B2 | 12/2008 | Xi et al. |
| 7,465,666 | B2 | 12/2008 | Kori et al. |
| 7,485,340 | B2 | 2/2009 | Elers et al. |
| 7,501,343 | B2 | 3/2009 | Byun et al. |
| 7,501,344 | B2 | 3/2009 | Byun et al. |
| 7,560,581 | B2 | 7/2009 | Gordon et al. |
| 7,563,718 | B2 | 7/2009 | Kim |
| 7,589,017 | B2 | 9/2009 | Chan et al. |
| 7,595,263 | B2 | 9/2009 | Chung et al. |
| 7,605,083 | B2 | 10/2009 | Lai et al. |
| 7,611,990 | B2 | 11/2009 | Yoon et al. |
| 7,655,567 | B1 | 2/2010 | Gao et al. |
| 7,674,715 | B2 | 3/2010 | Kori et al. |
| 7,675,119 | B2 | 3/2010 | Taguwa |
| 7,691,749 | B2 | 4/2010 | Levy et al. |
| 7,695,563 | B2 | 4/2010 | Lu et al. |
| 7,709,385 | B2 | 5/2010 | Xi et al. |
| 7,732,327 | B2 | 6/2010 | Lee et al. |
| 7,745,329 | B2 | 6/2010 | Wang et al. |
| 7,745,333 | B2 | 6/2010 | Lai et al. |
| 7,749,815 | B2 | 7/2010 | Byun |
| 7,754,604 | B2 | 7/2010 | Wongsenakhum et al. |
| 7,772,114 | B2 | 8/2010 | Chan et al. |
| 7,955,972 | B2 | 6/2011 | Chan et al. |
| 7,964,505 | B2 | 6/2011 | Khandelwal et al. |
| 7,977,243 | B2 | 7/2011 | Sakamoto et al. |
| 8,048,805 | B2 | 11/2011 | Chan et al. |
| 8,053,365 | B2 | 11/2011 | Humayun et al. |
| 8,058,170 | B2 | 11/2011 | Chandrashekar et al. |
| 8,062,977 | B1 | 11/2011 | Ashtiani et al. |
| 8,071,478 | B2 | 12/2011 | Wu et al. |
| 8,087,966 | B2 | 1/2012 | Hebbinghaus et al. |
| 8,101,521 | B1 | 1/2012 | Gao et al. |
| 8,110,877 | B2 | 2/2012 | Mukherjee et al. |
| 8,119,527 | B1 | 2/2012 | Chadrashekar et al. |
| 8,129,270 | B1 | 3/2012 | Chandrashekar et al. |
| 8,207,062 | B2 | 6/2012 | Gao et al. |
| 8,258,057 | B2 | 9/2012 | Kuhn et al. |
| 8,278,216 | B1 | 10/2012 | Alers et al. |
| 8,329,576 | B2 | 12/2012 | Chan et al. |
| 8,367,546 | B2 | 2/2013 | Humayun et al. |
| 8,409,985 | B2 | 4/2013 | Chan et al. |
| 8,409,987 | B2 | 4/2013 | Chandrashekar et al. |
| 8,551,885 | B2 | 10/2013 | Chen et al. |
| 8,623,733 | B2 | 1/2014 | Chen et al. |

(56) References Cited

U.S. PATENT DOCUMENTS

| | | | |
|---|---|---|---|
| 8,709,948 B2 | 4/2014 | Danek et al. | |
| 8,853,080 B2 | 10/2014 | Guan et al. | |
| 8,975,184 B2 | 3/2015 | Chen et al. | |
| 8,993,055 B2 | 3/2015 | Rahtu et al. | |
| 9,034,760 B2 | 5/2015 | Chen et al. | |
| 9,076,843 B2 | 7/2015 | Lee et al. | |
| 9,082,826 B2 | 7/2015 | Chandrashekar et al. | |
| 9,153,486 B2 | 10/2015 | Arghavani et al. | |
| 9,159,571 B2 | 10/2015 | Humayun et al. | |
| 9,236,297 B2 | 1/2016 | Chen et al. | |
| 9,240,347 B2 | 1/2016 | Chandrashekar et al. | |
| 9,583,385 B2 | 2/2017 | Lee et al. | |
| 9,589,808 B2 | 3/2017 | Bamnolker et al. | |
| 9,595,470 B2 | 3/2017 | Bamnolker et al. | |
| 9,613,818 B2 | 4/2017 | Ba et al. | |
| 9,653,353 B2 | 5/2017 | Chandrashekar et al. | |
| 9,673,146 B2 | 6/2017 | Chen et al. | |
| 9,754,824 B2 | 9/2017 | Schloss et al. | |
| 9,969,622 B2 | 5/2018 | Lei et al. | |
| 9,978,605 B2 | 5/2018 | Bamnolker et al. | |
| 10,094,021 B2 | 10/2018 | Lansalot-Matras et al. | |
| 10,103,058 B2 | 10/2018 | Chandrashekar et al. | |
| 10,121,671 B2 | 11/2018 | Fu et al. | |
| 10,283,404 B2 | 5/2019 | Na et al. | |
| 10,510,590 B2 | 12/2019 | Thombare et al. | |
| 10,546,751 B2 | 1/2020 | Bamnolker et al. | |
| 10,573,522 B2 | 2/2020 | Jandl et al. | |
| 10,777,453 B2 | 9/2020 | Thombare et al. | |
| 11,348,795 B2 | 5/2022 | Schloss et al. | |
| 11,355,345 B2 | 6/2022 | Jandl et al. | |
| 2001/0007797 A1 | 7/2001 | Jang et al. | |
| 2001/0008808 A1 | 7/2001 | Gonzalez | |
| 2001/0014533 A1 | 8/2001 | Sun | |
| 2001/0015494 A1 | 8/2001 | Ahn | |
| 2001/0044041 A1 | 11/2001 | Badding et al. | |
| 2002/0024140 A1 | 2/2002 | Nakajima et al. | |
| 2002/0037630 A1 | 3/2002 | Agarwal et al. | |
| 2002/0048938 A1 | 4/2002 | Ishizuka et al. | |
| 2002/0090796 A1 | 7/2002 | Desai et al. | |
| 2002/0117399 A1 | 8/2002 | Chen et al. | |
| 2002/0155722 A1 | 10/2002 | Satta et al. | |
| 2002/0168840 A1 | 11/2002 | Hong et al. | |
| 2002/0177316 A1 | 11/2002 | Miller et al. | |
| 2002/0190379 A1 | 12/2002 | Jian et al. | |
| 2003/0013300 A1 | 1/2003 | Byun | |
| 2003/0019428 A1 | 1/2003 | Ku et al. | |
| 2003/0059980 A1 | 3/2003 | Chen et al. | |
| 2003/0082296 A1* | 5/2003 | Elers | C23C 16/45531 174/256 |
| 2003/0082902 A1 | 5/2003 | Fukui et al. | |
| 2003/0091870 A1 | 5/2003 | Bhowmik et al. | |
| 2003/0104126 A1 | 6/2003 | Fang et al. | |
| 2003/0123216 A1 | 7/2003 | Yoon et al. | |
| 2003/0127043 A1 | 7/2003 | Lu et al. | |
| 2003/0129828 A1 | 7/2003 | Cohen | |
| 2003/0190802 A1 | 10/2003 | Wang et al. | |
| 2003/0194825 A1 | 10/2003 | Law et al. | |
| 2003/0209193 A1 | 11/2003 | Van Wijck | |
| 2003/0224217 A1 | 12/2003 | Byun et al. | |
| 2004/0014315 A1 | 1/2004 | Lai et al. | |
| 2004/0044127 A1 | 3/2004 | Okubo et al. | |
| 2004/0142557 A1 | 7/2004 | Levy et al. | |
| 2004/0151845 A1 | 8/2004 | Nguyen et al. | |
| 2004/0202786 A1 | 10/2004 | Wongsenakhum et al. | |
| 2004/0206267 A1 | 10/2004 | Sambasivan et al. | |
| 2004/0247788 A1 | 12/2004 | Fang et al. | |
| 2005/0009325 A1 | 1/2005 | Chung et al. | |
| 2005/0031786 A1 | 2/2005 | Lee et al. | |
| 2005/0059236 A1 | 3/2005 | Nishida et al. | |
| 2005/0136594 A1 | 6/2005 | Kim | |
| 2005/0191803 A1 | 9/2005 | Matsuse et al. | |
| 2005/0277296 A1 | 12/2005 | Adetutu et al. | |
| 2005/0282384 A1 | 12/2005 | Nawafune et al. | |
| 2006/0003581 A1 | 1/2006 | Johnston et al. | |
| 2006/0040052 A1* | 2/2006 | Fang | C23C 16/0218 427/248.1 |
| 2006/0046521 A1 | 3/2006 | Vaartstra et al. | |
| 2006/0094238 A1 | 5/2006 | Levy et al. | |
| 2006/0102950 A1 | 5/2006 | Takebuchi et al. | |
| 2006/0145190 A1 | 7/2006 | Salzman et al. | |
| 2006/0211244 A1 | 9/2006 | Deshpande et al. | |
| 2006/0284317 A1 | 12/2006 | Ito et al. | |
| 2007/0009658 A1* | 1/2007 | Yoo | C30B 25/02 257/E21.171 |
| 2007/0066060 A1 | 3/2007 | Wang | |
| 2007/0077712 A1 | 4/2007 | Joo et al. | |
| 2007/0087560 A1 | 4/2007 | Kwak et al. | |
| 2007/0099420 A1 | 5/2007 | Dominguez et al. | |
| 2007/0190780 A1 | 8/2007 | Chung et al. | |
| 2007/0264105 A1 | 11/2007 | Pharand et al. | |
| 2008/0014352 A1 | 1/2008 | Xi et al. | |
| 2008/0017891 A1 | 1/2008 | Datta et al. | |
| 2008/0045010 A1 | 2/2008 | Wongsenakhum et al. | |
| 2008/0081127 A1 | 4/2008 | Thompson et al. | |
| 2008/0081452 A1 | 4/2008 | Kim et al. | |
| 2008/0081453 A1 | 4/2008 | Kim et al. | |
| 2008/0124926 A1 | 5/2008 | Chan et al. | |
| 2008/0227291 A1 | 9/2008 | Lai et al. | |
| 2008/0248649 A1 | 10/2008 | Adetutu et al. | |
| 2008/0254619 A1 | 10/2008 | Lin et al. | |
| 2008/0254623 A1 | 10/2008 | Chan et al. | |
| 2008/0268642 A1* | 10/2008 | Yanagita | H01L 21/28556 438/680 |
| 2008/0280438 A1 | 11/2008 | Lai et al. | |
| 2008/0283844 A1 | 11/2008 | Hoshi et al. | |
| 2008/0317954 A1 | 12/2008 | Lu et al. | |
| 2008/0317972 A1* | 12/2008 | Hendriks | C23C 16/401 427/569 |
| 2009/0004848 A1 | 1/2009 | Kim et al. | |
| 2009/0045517 A1 | 2/2009 | Sugiura et al. | |
| 2009/0050937 A1 | 2/2009 | Murata et al. | |
| 2009/0053893 A1 | 2/2009 | Khandelwal et al. | |
| 2009/0137117 A1 | 5/2009 | Park et al. | |
| 2009/0142509 A1 | 6/2009 | Yamamoto | |
| 2009/0149022 A1 | 6/2009 | Chan et al. | |
| 2009/0156004 A1 | 6/2009 | Kori et al. | |
| 2009/0160030 A1 | 6/2009 | Tuttle | |
| 2009/0163025 A1 | 6/2009 | Humayun et al. | |
| 2009/0239368 A1 | 9/2009 | Park et al. | |
| 2009/0315154 A1 | 12/2009 | Kirby et al. | |
| 2010/0007797 A1 | 1/2010 | Stojancic | |
| 2010/0035427 A1 | 2/2010 | Chan et al. | |
| 2010/0055904 A1 | 3/2010 | Chen et al. | |
| 2010/0062149 A1 | 3/2010 | Ma et al. | |
| 2010/0072623 A1 | 3/2010 | Prindle et al. | |
| 2010/0107927 A1 | 5/2010 | Stewart et al. | |
| 2010/0120245 A1 | 5/2010 | Tjandra et al. | |
| 2010/0130002 A1 | 5/2010 | Dao et al. | |
| 2010/0130003 A1 | 5/2010 | Lin et al. | |
| 2010/0144140 A1 | 6/2010 | Chandrashekar et al. | |
| 2010/0155846 A1 | 6/2010 | Mukherjee et al. | |
| 2010/0159694 A1 | 6/2010 | Chandrashekar et al. | |
| 2010/0167527 A1 | 7/2010 | Wu et al. | |
| 2010/0213541 A1 | 8/2010 | Jeon et al. | |
| 2010/0244141 A1 | 9/2010 | Beyer et al. | |
| 2010/0244260 A1 | 9/2010 | Hinomura | |
| 2010/0267230 A1 | 10/2010 | Chandrashekar et al. | |
| 2010/0267235 A1 | 10/2010 | Chen et al. | |
| 2010/0273327 A1 | 10/2010 | Chan et al. | |
| 2010/0320607 A1 | 12/2010 | Suzuki | |
| 2010/0330800 A1 | 12/2010 | Ivanov et al. | |
| 2011/0020546 A1* | 1/2011 | Hamalainen | C23C 16/18 427/250 |
| 2011/0021024 A1 | 1/2011 | Calvo-Munoz et al. | |
| 2011/0059608 A1 | 3/2011 | Gao et al. | |
| 2011/0156154 A1 | 6/2011 | Hoentschel et al. | |
| 2011/0221044 A1 | 9/2011 | Danek et al. | |
| 2011/0223763 A1 | 9/2011 | Chan et al. | |
| 2011/0233778 A1 | 9/2011 | Lee et al. | |
| 2011/0236594 A1 | 9/2011 | Haverkamp et al. | |
| 2011/0256645 A1 | 10/2011 | Tam et al. | |
| 2011/0281438 A1 | 11/2011 | Lee et al. | |
| 2011/0287184 A1 | 11/2011 | Shenai-Khatkhate et al. | |

(56) References Cited

U.S. PATENT DOCUMENTS

| | | |
|---|---|---|
| 2012/0009785 A1 | 1/2012 | Chandrashekar et al. |
| 2012/0015518 A1 | 1/2012 | Chandrashekar et al. |
| 2012/0040530 A1 | 2/2012 | Humayun et al. |
| 2012/0045589 A1 | 2/2012 | Ivanov et al. |
| 2012/0077342 A1 | 3/2012 | Gao et al. |
| 2012/0164832 A1 | 6/2012 | Chandrashekar et al. |
| 2012/0187305 A1 | 7/2012 | Elam et al. |
| 2012/0199887 A1 | 8/2012 | Chan et al. |
| 2012/0225192 A1 | 9/2012 | Yudovsky et al. |
| 2012/0231626 A1 | 9/2012 | Lee et al. |
| 2012/0244699 A1 | 9/2012 | Khandelwal et al. |
| 2012/0294874 A1 | 11/2012 | Macary et al. |
| 2013/0043554 A1 | 2/2013 | Piper |
| 2013/0062677 A1 | 3/2013 | Li et al. |
| 2013/0109172 A1 | 5/2013 | Collins et al. |
| 2013/0168864 A1 | 7/2013 | Lee et al. |
| 2013/0189837 A1 | 7/2013 | Haukka et al. |
| 2013/0285195 A1 | 10/2013 | Piper |
| 2013/0302980 A1 | 11/2013 | Chandrashekar et al. |
| 2014/0011358 A1 | 1/2014 | Chen et al. |
| 2014/0027664 A1 | 1/2014 | Lei et al. |
| 2014/0030889 A1 | 1/2014 | Chen et al. |
| 2014/0061784 A1 | 3/2014 | Kang |
| 2014/0061931 A1 | 3/2014 | Kang |
| 2014/0073135 A1 | 3/2014 | Guan et al. |
| 2014/0106083 A1 | 4/2014 | Wu et al. |
| 2014/0147589 A1 | 5/2014 | Khandelwal et al. |
| 2014/0154883 A1 | 6/2014 | Humayun et al. |
| 2014/0162451 A1 | 6/2014 | Chen et al. |
| 2014/0308812 A1 | 10/2014 | Arghavani et al. |
| 2014/0319614 A1 | 10/2014 | Paul et al. |
| 2015/0037972 A1 | 2/2015 | Danek et al. |
| 2015/0056803 A1 | 2/2015 | Chandrashekar et al. |
| 2015/0179461 A1 | 6/2015 | Bamnolker et al. |
| 2015/0262939 A1 | 9/2015 | Sakata |
| 2015/0279732 A1 | 10/2015 | Lee et al. |
| 2015/0325475 A1 | 11/2015 | Bamnolker et al. |
| 2015/0348840 A1 | 12/2015 | Bamnolker et al. |
| 2015/0354064 A1 | 12/2015 | Kolics et al. |
| 2016/0040289 A1 | 2/2016 | Gatineau et al. |
| 2016/0077435 A1 | 3/2016 | Ban et al. |
| 2016/0109800 A1 | 4/2016 | Bae et al. |
| 2016/0118345 A1 | 4/2016 | Chen et al. |
| 2016/0172211 A1 | 6/2016 | Demos et al. |
| 2016/0181272 A1 | 6/2016 | Rabkin et al. |
| 2016/0190008 A1 | 6/2016 | Chandrashekar et al. |
| 2016/0233220 A1 | 8/2016 | Danek et al. |
| 2016/0293467 A1 | 10/2016 | Caveney et al. |
| 2016/0336222 A1 | 11/2016 | Knapp et al. |
| 2016/0351401 A1* | 12/2016 | Ba ..................... C23C 16/455 |
| 2016/0351402 A1 | 12/2016 | Suzuki et al. |
| 2016/0351444 A1 | 12/2016 | Schloss et al. |
| 2017/0062224 A1 | 3/2017 | Fu et al. |
| 2017/0069527 A1 | 3/2017 | Haukka et al. |
| 2017/0117155 A1* | 4/2017 | Bamnolker ....... H01L 21/76876 |
| 2017/0125548 A1 | 5/2017 | Hung et al. |
| 2017/0133231 A1 | 5/2017 | Bamnolker et al. |
| 2017/0229341 A1 | 8/2017 | Chang et al. |
| 2017/0268107 A1 | 9/2017 | Lansalot-Matras et al. |
| 2018/0019165 A1 | 1/2018 | Baum et al. |
| 2018/0053660 A1* | 2/2018 | Jandl ................. H01L 21/76877 |
| 2018/0142345 A1 | 5/2018 | Meng et al. |
| 2018/0240675 A1* | 8/2018 | Bamnolker ....... H01L 21/28568 |
| 2018/0261503 A1 | 9/2018 | Meng et al. |
| 2018/0294187 A1 | 10/2018 | Thombare et al. |
| 2018/0355484 A1 | 12/2018 | Lansalot-Matras et al. |
| 2019/0003050 A1 | 1/2019 | Dezelah et al. |
| 2019/0019725 A1 | 1/2019 | Chandrashekar et al. |
| 2019/0067003 A1 | 2/2019 | Zope et al. |
| 2019/0067094 A1 | 2/2019 | Zope et al. |
| 2019/0161853 A1 | 5/2019 | Aoyama et al. |
| 2019/0226086 A1 | 7/2019 | Wright, Jr. et al. |
| 2019/0256467 A1 | 8/2019 | Anthis et al. |
| 2020/0075403 A1 | 3/2020 | Thombare et al. |
| 2020/0144066 A1 | 5/2020 | Jandl et al. |
| 2020/0365456 A1 | 11/2020 | Thombare et al. |
| 2020/0402846 A1 | 12/2020 | Collins et al. |
| 2021/0335617 A1 | 10/2021 | Deng et al. |
| 2021/0407809 A1 | 12/2021 | Zope et al. |
| 2022/0013365 A1 | 1/2022 | Van Cleemput et al. |
| 2022/0170155 A1 | 6/2022 | Blakeney |
| 2022/0181158 A1 | 6/2022 | Bowes et al. |
| 2022/0195598 A1 | 6/2022 | Collins et al. |
| 2022/0223471 A1 | 7/2022 | Thombare et al. |
| 2022/0254685 A1 | 8/2022 | Ermez et al. |
| 2022/0262640 A1 | 8/2022 | Jandl et al. |
| 2022/0298624 A1 | 9/2022 | Blakeney et al. |
| 2022/0328317 A1 | 10/2022 | Na et al. |
| 2022/0356579 A1 | 11/2022 | Collins et al. |
| 2022/0359211 A1 | 11/2022 | Van Cleemput et al. |
| 2022/0364232 A1 | 11/2022 | Nannapaneni et al. |
| 2022/0375792 A1 | 11/2022 | Schloss et al. |

FOREIGN PATENT DOCUMENTS

| | | |
|---|---|---|
| CN | 101447427 A | 6/2009 |
| CN | 101770978 A | 7/2010 |
| CN | 101952945 A | 1/2011 |
| CN | 103125013 A | 5/2013 |
| EP | 0437110 A2 | 7/1991 |
| EP | 1156132 A2 | 11/2001 |
| EP | 1179838 A2 | 2/2002 |
| EP | 1728894 A1 | 12/2006 |
| JP | S5629648 A | 3/1981 |
| JP | H02187031 A | 7/1990 |
| JP | H04142061 A | 5/1992 |
| JP | H05226280 A | 9/1993 |
| JP | H07147321 A | 6/1995 |
| JP | H07226393 A | 8/1995 |
| JP | H08115984 A | 5/1996 |
| JP | H0922896 A | 1/1997 |
| JP | H0927596 A | 1/1997 |
| JP | H10144688 A | 5/1998 |
| JP | H10163132 A | 6/1998 |
| JP | 2966406 B2 | 10/1999 |
| JP | H11330006 A | 11/1999 |
| JP | 2000208516 A | 7/2000 |
| JP | 2000235962 A | 8/2000 |
| JP | 2001284360 A | 10/2001 |
| JP | 2001525889 A | 12/2001 |
| JP | 2002016066 A | 1/2002 |
| JP | 2002124488 A | 4/2002 |
| JP | 2003193233 A | 7/2003 |
| JP | 2004235456 A | 8/2004 |
| JP | 2004273764 A | 9/2004 |
| JP | 2004536960 A | 12/2004 |
| JP | 2005029821 A | 2/2005 |
| JP | 2005150416 A | 6/2005 |
| JP | 2005518088 A | 6/2005 |
| JP | 2007009298 A | 1/2007 |
| JP | 2007027627 A | 2/2007 |
| JP | 2007027680 A | 2/2007 |
| JP | 2007507892 A | 3/2007 |
| JP | 2007520052 A | 7/2007 |
| JP | 2007250907 A | 9/2007 |
| JP | 2007251164 A | 9/2007 |
| JP | 2008016803 A | 1/2008 |
| JP | 2008060603 A | 3/2008 |
| JP | 2008091844 A | 4/2008 |
| JP | 2008205219 A | 9/2008 |
| JP | 2008211183 A | 9/2008 |
| JP | 2008283220 A | 11/2008 |
| JP | 2008303466 A | 12/2008 |
| JP | 2009024252 A | 2/2009 |
| JP | 2009144242 A | 7/2009 |
| JP | 2009533877 A | 9/2009 |
| JP | 2009540123 A | 11/2009 |
| JP | 2010251760 A | 11/2010 |
| JP | 2011035366 A | 2/2011 |
| JP | 2011192680 A | 9/2011 |
| JP | 2013080891 A | 5/2013 |
| JP | 2014049747 A | 3/2014 |
| JP | 2014074190 A | 4/2014 |
| JP | 2015067869 A | 4/2015 |

(56) References Cited

FOREIGN PATENT DOCUMENTS

| | | | |
|---|---|---|---|
| JP | 2016098406 A | 5/2016 |
| KR | 100196018 B1 | 6/1999 |
| KR | 100272523 B1 | 12/2000 |
| KR | 20010093766 A | 10/2001 |
| KR | 20020040877 A | 5/2002 |
| KR | 20020049730 A | 6/2002 |
| KR | 20030050652 A | 6/2003 |
| KR | 20050022261 A | 3/2005 |
| KR | 20050054122 A | 6/2005 |
| KR | 1020030087448 | 6/2005 |
| KR | 20050068555 A | 7/2005 |
| KR | 20050087428 A | 8/2005 |
| KR | 20060087844 A | 8/2006 |
| KR | 100705936 B1 | 4/2007 |
| KR | 20080001460 A | 1/2008 |
| KR | 20080036679 A | 4/2008 |
| KR | 20080060012 A | 7/2008 |
| KR | 20080061978 A | 7/2008 |
| KR | 20080101745 A | 11/2008 |
| KR | 20080110897 A | 12/2008 |
| KR | 20090068187 A | 6/2009 |
| KR | 20090074560 A | 7/2009 |
| KR | 20090095546 A | 9/2009 |
| KR | 20090103815 A | 10/2009 |
| KR | 20100014714 A | 2/2010 |
| KR | 20100029952 A | 3/2010 |
| KR | 20100096488 A | 9/2010 |
| KR | 20100114856 A | 10/2010 |
| KR | 20110027607 A | 3/2011 |
| KR | 20110056494 A | 5/2011 |
| KR | 20110084166 A | 7/2011 |
| KR | 20110105645 A | 9/2011 |
| KR | 20110108382 A | 10/2011 |
| KR | 20130119519 A | 10/2013 |
| KR | 101495372 B1 | 2/2015 |
| KR | 20150063562 A | 6/2015 |
| KR | 20150108780 A | 9/2015 |
| KR | 20150128615 A | 11/2015 |
| KR | 20160098986 A | 8/2016 |
| KR | 101745074 B1 | 6/2017 |
| KR | 102255768 B1 | 5/2021 |
| TW | 310461 B | 7/1997 |
| TW | 434708 B | 5/2001 |
| TW | 452607 B | 9/2001 |
| TW | 567544 B | 12/2003 |
| TW | 200626748 A | 8/2006 |
| TW | 200710968 A | 3/2007 |
| TW | 201405781 A | 2/2014 |
| TW | 201409697 A | 3/2014 |
| TW | 201519317 A | 5/2015 |
| WO | WO-9851838 A1 | 11/1998 |
| WO | WO-0127347 A1 | 4/2001 |
| WO | WO-0129893 A1 | 4/2001 |
| WO | WO-0241379 A1 | 5/2002 |
| WO | WO-03029515 A2 | 4/2003 |
| WO | WO-2005027211 A1 | 3/2005 |
| WO | WO-2005034223 A1 | 4/2005 |
| WO | WO-2006036865 A2 | 4/2006 |
| WO | WO-2007121249 A2 | 10/2007 |
| WO | WO-2007146537 A2 | 12/2007 |
| WO | WO-2010025357 A2 | 3/2010 |
| WO | WO-2011119293 A2 | 9/2011 |
| WO | WO-2012047591 A1 | 4/2012 |
| WO | WO-2013148880 A1 | 10/2013 |
| WO | WO-2014058536 A1 | 4/2014 |
| WO | WO-2015023404 A1 | 2/2015 |
| WO | WO-2016191432 A1 | 12/2016 |
| WO | WO-2018191183 A1 | 10/2018 |
| WO | WO-2019036292 A1 | 2/2019 |
| WO | WO-2019055317 A1 | 3/2019 |
| WO | WO-2020023790 A1 | 1/2020 |
| WO | WO-2020028587 A1 | 2/2020 |
| WO | WO-2020185618 A1 | 9/2020 |

OTHER PUBLICATIONS

Johnson, Richard W., et al., "A brief review of atomic layer deposition: from fundamentals to applications". Materials Today, vol. 17, No. 5, Jun. 2014, pp. 236-246.*
Li, Zhengwen, et al., "Atomic Layer Deposition of Ultrathin Copper Metal Films from a Liquid Copper(I) Amidinate Precursor". Journal of the Electrochemical Society, 153 (11) C787-C794, 2006.*
Wilt, Jamie, et al., "In situ atomic layer deposition and electron tunneling characterization of monolayer Al2O3 on Fe for magnetic tunnel junctions". AIP Advances 8, 125218 (2018), pp. 1-9.*
Kim, Kyu-Beom, et al., "Simulation of Residual Stress and Its Impact on a Poly-Silicon Channel for Three-Dimensional, Stacked, Vertical-NAND Flash Memories". Journal of the Korean Physical Society, vol. 70, No. 12, Jun. 2017, pp. 1041-1048.*
Semiconductor Digest News and Industry Trends for Solid State Technology, "Lam Research enables next-generation memory with industry's first ALD process for low-fluorine tungsten fill" Aug. 2016, 2 pages. No author.*
Dominique, Suhr, et al., "An alternative to Tungsten in 3D-NAND technology," 2021 IEEE International Interconnect Technology Conference (IITC), 2021, pp. 1-3.*
Coventor brochure: "3D NAND: Challenges beyond 96-Layer Memory Arrays". Oct. 12, 2018, pp. 1-4.*
Lam brochure: "ALD Tungsten Solves Capacity Challenges in 3D Nand Device Manufacturing". Jan. 22, 2019, pp. 1-4.*
International Search Report and Written Opinion dated Aug. 18, 2019, in Application No. PCT/US2019/030712.
Aldjapan.com "Principle-ALD Japan, Inc." [webpage] pp. 1-10. [retrieved from URL: https://aldjapan.com/%E5%8E%9F%E7%90%86/].
Becker, Jill (Apr. 7, 2003) "Diffusion barrier properties of tungsten nitride films grown by atomic layer deposition from bis(tert-butylimido)bis(dimethylamido)tungsten and ammonia," Applied Physics Letters, 82(14):2239-2241, [Retrieved online Dec. 13, 2013 at http://dx.doi.org/10.1063/1.1565699].
Bell et al. (Jan. 1996) "Batch Reactor Kinetic Studies of Tungsten LPCVD from Silane and Tungsten Hexafluoride", J. Electrochem. Soc., 143(1):296-302.
Chinese Fifth Office Action dated Aug. 24, 2018 issued in Application No. CN 201380022693.8.
Chinese Fifth Office Action dated May 5, 2015 issued in Application No. CN 200980133560.1.
Chinese First Office Action dated Jan. 4, 2021 issued in Application No. CN 201710700258.6.
Chinese First Office Action dated Jun. 2, 2017 issued in Application No. CN 201410856793.7.
Chinese First Office Action dated Mar. 18, 2016 issued in Application No. CN 201380022693.8.
Chinese First Office Action dated Oct. 27, 2020 issued in Application No. CN 201811491805.5.
Chinese First Office Action dated Sep. 18, 2012 issued in Application No. CN 200980133560.1.
Chinese First Office Action dated Sep. 6, 2015 issued in Application No. CN 201310320848.8.
Chinese Fourth Office Action dated Jan. 5, 2015 issued in Application No. CN 200980133560.1.
Chinese Fourth Office Action dated Mar. 15, 2018 issued in Application No. CN 201380022693.8.
Chinese Second Office Action dated Aug. 7, 2013 issued in Application No. CN 200980133560.1.
Chinese Second Office Action dated Feb. 5, 2018 issued in Application No. CN 201410856793.7.
Chinese Second Office Action dated Jan. 23, 2017 issued in Application No. CN 201380022693.8.
Chinese Second Office Action dated Jun. 17, 2021 issued in Application No. CN 201710700258.6.
Chinese Second Office Action dated May 16, 2016 issued in Application No. CN 201310320848.8.
Chinese Third Office Action dated Apr. 22, 2014 issued in Application No. CN 200980133560.1.

(56) References Cited

OTHER PUBLICATIONS

Chinese Third Office Action dated Oct. 8, 2018 issued in Application No. CN 201410856793.7.
Chinese Third Office Action dated Sep. 25, 2017 issued in Application No. CN 201380022693.8.
Collins et al. (Jan. 21, 2003) "Pulsed Deposition of Ultra Thin Tungsten for Plugfill of High Aspect Ratio Contacts," Presentation made at Semicon Korea, 9 pages.
Diawara, Y. et al. (1993) "Rapid thermal annealing for reducing stress in tungsten x-ray mask absorber," http://dx.doi.org/10.1116/1.586673, Journal of Vacuum Science & Technology B 11:296-300 (per table of contents of journal).
Elam et al. (2001) "Nucleation and Growth During Tungsten Atomic Layer Deposition on SiO2 Surfaces," Thin Solid Films, 13pp.
Fair, James A. (1983) Presentation by Inventor "Chemical Vapor Deposition of Refractory Metal Silicides," GENUS Incorporated, 27 pp.
Final Office Action dated May 23, 2019 issued in U.S. Appl. No. 15/948,143.
Final Office Action dated Sep. 2, 2021 issued in U.S. Appl. No. 16/947,286.
George et al. (1996) "Surface Chemistry for atomic Layer Growth", J. Phys. Chem, 100(31):13121-13131.
Gonohe, Narishi (2002) "Tungsten Nitride Deposition by Thermal Chemical Vapor Deposition as Barrier Metal for Cu Interconnection," [http://www.jim.co.jp/journal/e/pdf3/43/07/1585.pdf.], Materials Transactions, 43(7):1585-1592.
Habuka, Hitoshi (2010) "Advance of Atomic Layer Deposition in Semiconductor Materials Manufacturing Process: Cleaning Technology for Thin Film Formation Reactor" Department of Chemical and Energy Engineering, Yokohama National University, 79, 5 Tokiwadai Hodogaya-ku Kanagawa 240, 8501, Japan.
Hoover, Cynthia (Jul. 2007) "Enabling Materials for Contact Metallization," Praxair Electronic Materials R&D, pp. 1-16.
International Preliminary Report on Patentability dated Aug. 12, 2021, issued in Application No. PCT/US2020/015241.
International Preliminary Report on Patentability dated Feb. 4, 2021 in Application No. PCT/US2019/043514.
International Preliminary Report on Patentability dated Jun. 24, 2021 issued in Application No. PCT/US2019/066301.
International Preliminary Report on Patentability dated Jun. 3, 2021 in Application No. PCT/US2019/062067.
International Preliminary Report on Patentability dated Jun. 4, 2020 in Application No. PCT/US2018/061803.
International Preliminary Report on Patentability dated Nov. 19, 2020 in Application No. PCT/US2019/030712.
International Preliminary Report on Patentability dated Oct. 21, 2021, in application No. PCT/US2020/027107.
International Preliminary Report on Patentability dated Oct. 24, 2019 in Application No. PCT/US2018/026746.
International Preliminary Report on Patentability dated Sep. 23, 2021 issued in Application No. PCT/US2020/021543.
International Search Report and Written Opinion dated Apr. 13, 2020 issued in Application No. PCT/US2019/066301.
International Search Report and Written Opinion dated Jul. 1, 2020 in Application No. PCT/US2020/021543.
International Search Report and Written Opinion dated Jul. 24, 2020 issued in Application No. PCT/US2020/027107.
International Search Report and Written Opinion dated Jul. 27, 2018 in Application No. PCT/US2018/026746.
International Search Report and Written Opinion dated Jun. 3, 2020, issued in Application No. PCT/US2020/015241.
International Search Report and Written Opinion dated Mar. 8, 2019 in Application No. PCT/US2018/061803.
International Search Report and Written Opinion dated Mar. 9, 2020 in Application No. PCT/US2019/062067.
International Search Report and Written Opinion dated Nov. 11, 2019 in Application No. PCT/US2019/043514.
International Search Report and Written Opinion dated Nov. 11, 2020 issued in Application No. PCT/US2020/070434.
Japanese First Office Action dated Jun. 24, 2020 issued in Application No. JP 2016-105216.
Japanese First Office Action dated Jun. 3, 2020 issued in Application No. JP 2016-104837.
Japanese Notification of Reasons for Rejection dated Dec. 20, 2016 issued in Application No. JP 2015-503547.
Japanese Office Action dated Dec. 3, 2013 issued in Application No. JP 2011-525228.
Japanese Office Action dated Jul. 29, 2014 issued in Application No. JP 2010-093544.
Japanese Office Action dated Jun. 17, 2014 issued in Application No. JP 2010-055163.
Japanese Office Action dated Mar. 4, 2014 issued in Application No. JP 2010-093522.
Japanese Office Action dated May 7, 2013, issued in Application No. JP 2008-310322.
Japanese Office Action dated Sep. 3, 2013, issued in Application No. JP 2008-325333.
Japanese Second Office Action dated Apr. 5, 2021 issued in Application No. JP 2016-104837.
Japanese Second Office Action dated Mar. 3, 2021 issued in Application No. JP 2016-105216.
Klaus et al. (2000) "Atomic layer deposition of tungsten using sequential surface chemistry with a sacrificial stripping reaction," Thin Solid Films 360:145-153.
Klaus et al. (2000) "Atomically Controlled Growth of Tungsten and Tungsten Nitride Using Sequential Surface Reactions," Applied Surface Science, pp. 162-163, 479-491.
Korean Decision for Grant dated Apr. 7, 2020 issued in Application No. KR 10-2020-7000199.
Korean Decision for Grant dated Nov. 5, 2021 issued in Application No. KR 10-2014-0192527.
Korean Final Rejection dated Jun. 30, 2021 issued in Application No. KR 10-2014-0192527.
Korean Final Rejection Office Action dated Apr. 27, 2021 issued in Application No. KR 10-2016-0064157.
Korean First Notification of Provisional Rejection, dated Dec. 8, 2010, issued in Application No. KR 2004-0036346.
Korean First Office Action dated Apr. 18, 2019 issued in Application No. KR 10-2014-7030125.
Korean First Office Action dated Aug. 2, 2021, issued in Application No. KR 10-2014-0184759.
Korean First Office Action dated Aug. 30, 2019 issued in Application No. KR 10-2013-0075854.
Korean First Office Action dated Aug. 6, 2020 issued in Application No. KR 10-2014-0044410.
Korean First Office Action dated Dec. 21, 2020 issued in Application No. KR 10-2014-0192527.
Korean First Office Action dated Jan. 1, 2019 issued in Application No. KR 10-2013-0089130.
Korean First Office Action dated Jul. 10, 2015 issued in Application No. KR 10-2014-0090283.
Korean First Office Action dated Jul. 12, 2021 issued in Application No. KR 10-2021-0063953.
Korean First Office Action dated Nov. 25, 2020 issued in Application No. KR 10-2020-0124056.
Korean First Office Action dated Oct. 1, 2020 issued in Application No. KR 10-2016-0064157.
Korean First Office Action dated Sep. 24, 2019 issued in Application No. KR 10-2013-0089834.
Korean First Office Action [No Translation] dated Oct. 21, 2019 issued in Application No. KR 10-2013-0108151.
Korean Notification of Provisional Rejection dated Jul. 17, 2012, issued in Application No. KR 2010-0087997.
Korean Office Action dated Jul. 19, 2013 issued in Application No. KR 2011-7004322.
Korean Office Action dated Jul. 28, 2021 issued in Application No. KR 10-2016-0064157.
Korean Office Action, dated Jun. 13, 2011, issued in Application No. KR 2011-0032098.

(56) References Cited

OTHER PUBLICATIONS

Korean Office Action dated Jun. 17, 2014 issued in Application No. KR 10-2013-7027117.
Korean Office Action dated Jun. 22, 2021 issued in Application No. KR 10-2020-0124056.
Korean Office Action dated Jun. 28, 2020 issued in Application No. KR 10-2020-0141428.
Korean Office Action dated Mar. 21, 2013 issued in Application No. KR 10-2010-0024905.
Korean Office Action, dated Mar. 28, 2013, issued in Application No. KR 10-2007-0012027.
Korean Office Action dated Mar. 4, 2013 in Application No. KR 2010-0035449.
Korean Office Action, dated Nov. 24, 2010, issued in Application No. KR 10-2004-0013210.
Korean Office Action dated Nov. 30, 2020 issued in Application No. KR 10-2020-0141428.
Korean Office Action dated Nov. 4, 2013 issued in Application No. KR 10-2013-7027117.
Korean Office Action dated Sep. 6, 2012 issued in Application No. KR 2011-7004322.
Korean Second Office Action dated Apr. 7, 2020 issued in Application No. KR 10-2013-0075854.
Korean Second Office Action dated Jan. 25, 2014 in Application No. KR 10-2010-0035453.
Korean Second Office Action dated Mar. 12, 2020 issued in Application No. KR 10-2013-0108151.
Korean Third Office Action dated Jun. 26, 2020 issued in Application No. KR 10-2013-0108151.
Korean Third Office Action dated Jun. 29, 2020 issued in Application No. KR 10-2013-0075854.
KR Final Rejection dated Oct. 5, 2021, in application No. KR1020200141428 with English translation.
Kurek et al. "Recent advances using guanidinate ligands for chemical vapour deposition (CVD) and atomic layer deposition (ALD) applications," Australian Journal of Chemistry, vol. 67, Jun. 2014, pp. 989-996.
Lai, Ken et al. (Jul. 17, 2000) "Tungsten chemical vapor deposition using tungsten hexacarbonyl: microstructure of as-deposited and annealed films," [http://dx.doi.org/10.1016/S0040-6090(00)00943-3], Thin Solid Films, 370:114-121.
Lai, Ken K. and Lamb, H. Henry (1995) "Precursors for Organometallic Chemical Vapor Deposition of Tungsten Carbide Films," Chemistry Material, 7(12):2284-2292.
Lee et al. (Jan. 21, 2003) "Pulsed Deposition of Ultra Thin Tungsten and its Application for Plugfill of High Aspect Ratio Contacts," Abstract, 1 page.
Li et al. (2002) "Deposition of WNxCy—Thin Films by ALCVDTM Method for Diffusion Barriers in Metallization," IITC Conference Report, 3 pp.
Majumder et al. "Investigation on the diffusion barrier properties of sputtered Mo/W—N thin films in Cu interconnects," Applied Physics Letters, vol. 91 (2007), pp. 162108-1-162108-3.
Manik. P, et al. (2012) "Fermi-level unpinning and low resistivity in contacts to n-type Ge with a thin ZnO interfacial layer," App. Phys. Lett. 101:182105-5.
Notice of Allowance dated Apr. 27, 2020 issued in U.S. Appl. No. 16/676,169.
Notice of Allowance dated Aug. 6, 2019 issued in U.S. Appl. No. 15/948,143.
Notice of Allowance dated Dec. 3, 2012, issued in U.S. Appl. No. 13/095,734.
Office Action dated Apr. 27, 2021 issued in U.S. Appl. No. 16/947,286.
Office Action dated Aug. 12, 2021 issued in U.S. Appl. No. 16/764,812.
Office Action dated Feb. 4, 2019 issued in U.S. Appl. No. 15/948,143.
Office Action Requirement for Restriction/Election dated Sep. 22, 2021 issued in U.S. Appl. No. 17/250,452.
Otsuka et al. A novel molybdenum thiolato compound, tetrakis (tertbutylthilolato molybdenum(IV),preparation and crystal and molecular structure Journal of American chemistry society, 1981, pp. 3011-3014.
PCT International Preliminary Report on Patentability and Written Opinion, dated Mar. 10, 2011, issued in PCT/US2009/055349.
PCT International Preliminary Report on Patentability and Written Opinion, dated Oct. 9, 2014, issued in PCT/US2013/034167.
PCT International Search Report and Written Opinion, dated Apr. 12, 2010, issued in PCT/US2009/055349.
PCT International Search Report and Written Opinion, dated Jul. 26, 2013, issued in PCT/US2013/034167.
PCT Search Report and Written Opinion, dated Jan. 19, 2005, issued in PCT/US2004/006940.
Saito et al. (2001) "A Novel Copper Interconnection Technology Using Self Aligned Metal Capping Method," IEEE, 3pp.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], Journal of Applied Physics, 58(11):4194-4199.
Specification of U.S. Appl. No. 62/425,704, filed Nov. 23, 2016.
Taiwan Examination Report dated Dec. 26, 2016 issued in Application No. TW 102123248.
Taiwan Examination Report, dated Jun. 22, 2017, issued in Application No. TW 103113287.
Taiwan Examination Report dated Mar. 16, 2017 issued in Application No. TW 102132433.
Taiwan Examination Report dated Oct. 26, 2016 issued in Application No. TW 102126696.
Taiwan Examination Report dated Oct. 26, 2016 issued in Application No. TW 102126976.
Taiwan First Office Action dated Jun. 27, 2018 issued in Application No. TW 103145125.
Taiwan First Office Action [Reissued] dated Jun. 20, 2018, issued in Application No. TW 103144260.
Taiwan Office Action and Search Report dated Feb. 12, 2015 issued in Application No. TW 099130354.
Taiwan Office Action dated Aug. 4, 2015 issued in Application No. TW 099111859.
Taiwan Office Action dated Dec. 27, 2014 issued in Application No. TW 099111860.
Taiwan Office Action dated Jan. 10, 2017 issued in Application No. TW 105105984.
Taiwan Office Action dated Jun. 8, 2015 issued in Application No. TW 099107504.
Taiwan Office Action dated Oct. 25, 2016 issued in Application No. TW 102110947.
Taiwan Office Action (Rejection Decision) dated Oct. 28, 2015 issued in Application No. TW 099130354.
Taiwan Search Report dated Nov. 30, 2016 issued in Application No. TW 099130354.
Taiwanese First Office Action dated Nov. 13, 2019 issued in Application No. TW 105116371.
Taiwanese First Office Action dated Nov. 25, 2019 issued in Application No. TW 105116363.
Taiwanese Second Office Action dated Aug. 19, 2020 issued in Application No. TW 105116371.
Taiwanese Third Office Action dated Mar. 16, 2021 issued in Application No. TW 105116371.
TW Office Action dated Oct. 18, 2021, in application No. TW107112210 with English translation.
U.S. Final Office Action, dated Apr. 14, 2017, issued in U.S. Appl. No. 14/965,806.
U.S. Final Office Action, dated Apr. 28, 2009, issued in U.S. Appl. No. 11/782,570.
U.S. Final Office Action, dated Apr. 30, 2012, issued in U.S. Appl. No. 12/755,248.
U.S. Final Office Action, dated Dec. 28, 2005, issued in U.S. Appl. No. 10/815,560.
U.S. Final Office Action, dated Dec. 30, 2010, issued in U.S. Appl. No. 11/963,698.
U.S. Final Office Action, dated Dec. 9, 2009, issued in U.S. Appl. No. 11/963,698.

(56) References Cited

OTHER PUBLICATIONS

U.S. Final Office Action, dated Feb. 14, 2014, issued in U.S. Appl. No. 13/560,688.
U.S. Final Office Action, dated Feb. 25, 2009, issued in U.S. Appl. No. 11/349,035.
U.S. Final Office Action, dated Feb. 26, 2009, issued in U.S. Appl. No. 11/265,531.
U.S. Final Office Action, dated Feb. 7, 2011, issued in U.S. Appl. No. 12/202,126.
U.S. Final Office Action, dated Jan. 13, 2010, issued in U.S. Appl. No. 12/030,645.
U.S. Final Office Action, dated Jan. 14, 2016, issued in U.S. Appl. No. 13/949,092.
U.S. Final Office Action, dated Jan. 20, 2017, issued in U.S. Appl. No. 14/723,275.
U.S. Final Office Action, dated Jan. 26, 2010 from U.S. Appl. No. 11/951,236.
U.S. Final Office Action, dated Jul. 14, 2005, issued in U.S. Appl. No. 10/649,351.
U.S. Final Office Action, dated Jul. 17, 2015, issued in U.S. Appl. No. 14/502,817.
U.S. Final Office Action, dated Jul. 2, 2014, issued in U.S. Appl. No. 13/020,748.
U.S. Final Office Action, dated Jul. 23, 2010, issued in U.S. Appl. No. 12/030,645.
U.S. Final Office Action, dated Jul. 25, 2016, issued in U.S. Appl. No. 14/738,685.
U.S. Final Office Action, dated Jun. 15, 2011, issued in U.S. Appl. No. 12/636,616.
U.S. Final Office Action, dated Jun. 2, 2015, issued in U.S. Appl. No. 14/097,160.
U.S. Final Office Action dated Mar. 21, 2019, issued in U.S. Appl. No. 15/415,800.
U.S. Final Office Action dated Mar. 29, 2021 issued in U.S. Appl. No. 16/724,231.
U.S. Final Office Action, dated May 17, 2006, issued in U.S. Appl. No. 10/984,126.
U.S. Final Office Action, dated May 18, 2017, issued in U.S. Appl. No. 13/949,092.
U.S. Final Office Action, dated May 31, 2016, issued in U.S. Appl. No. 14/135,375.
U.S. Final Office Action, dated May 7, 2010, issued in U.S. Appl. No. 12/202,126.
U.S. Final Office Action, dated Nov. 16, 2012, issued in U.S. Appl. No. 13/020,748.
U.S. Final Office Action, dated Nov. 17, 2011, issued in U.S. Appl. No. 12/829,119.
U.S. Final Office Action, dated Nov. 20, 2009, issued in U.S. Appl. No. 11/349,035.
U.S. Final Office Action, dated Nov. 26, 2013, issued in U.S. Appl. No. 13/633,798.
U.S. Final Office Action, dated Nov. 5, 2014, issued in U.S. Appl. No. 13/633,502.
U.S. Final Office Action, dated Oct. 16, 2014, issued in U.S. Appl. No. 13/862,048.
U.S. Final Office Action, dated Oct. 19, 2010, issued in U.S. Appl. No. 12/407,541.
U.S. Final Office Action, dated Sep. 12, 2012, issued in U.S. Appl. No. 12/755,259.
U.S. Final Office Action, dated Sep. 29, 2015, issued in U.S. Appl. No. 14/135,375.
U.S. Non-Final Office Action dated Nov. 19, 2021, in U.S. Appl. No. 17/250,452.
U.S. Notice of Allowance and Fee Due, dated Jan. 24, 2011, issued in U.S. Appl. No. 12/030,645.
U.S. Notice of Allowance,, dated Apr. 24, 2007, issued in U.S. Appl. No. 10/815,560.
U.S. Notice of Allowance, dated Apr. 28, 2015, issued in U.S. Appl. No. 13/862,048.
U.S. Notice of Allowance, dated Apr. 6, 2010, issued in U.S. Appl. No. 11/951,236.
U.S. Notice of Allowance, dated Aug. 25, 2006, issued in U.S. Appl. No. 10/984,126.
U.S. Notice of Allowance, dated Aug. 3, 2016, issued in U.S. Appl. No. 13/851,885.
U.S. Notice of Allowance, dated Aug. 7, 2012, issued in U.S. Appl. No. 12/829,119.
U.S. Notice of Allowance, dated Dec. 14, 2016, issued in U.S. Appl. No. 13/851,885.
U.S. Notice of Allowance dated Dec. 24, 2013, issued in U.S. Appl. No. 12/723,532.
U.S. Notice of Allowance, dated Jan. 12, 2018, issued in U.S. Appl. No. 13/949,092.
U.S. Notice of Allowance, dated Jan. 19, 2005, issued in U.S. Appl. No. 10/435,010.
U.S. Notice of Allowance, dated Jan. 19, 2018, issued in U.S. Appl. No. 15/398,462.
U.S. Notice of Allowance, dated Jan. 20, 2017, issued in U.S. Appl. No. 14/989,444.
U.S. Notice of Allowance, dated Jan. 22, 2015, issued in U.S. Appl. No. 13/928,216.
U.S. Notice of Allowance, dated Jul. 10, 2013, issued in U.S. Appl. No. 12/755,259.
U.S. Notice of Allowance, dated Jul. 21, 2006, issued in U.S. Appl. No. 10/649,351.
U.S. Notice of Allowance, dated Jul. 25, 2011, issued in U.S. Appl. No. 12/363,330.
U.S. Notice of Allowance, dated Jun. 17, 2015, issued in U.S. Appl. No. 13/862,048.
U.S. Notice of Allowance, dated Jun. 2, 2015, issued in U.S. Appl. No. 14/173,733.
U.S. Notice of Allowance, dated Jun. 30, 2011, issued in U.S. Appl. No. 12/538,770.
U.S. Notice of Allowance, dated Jun. 7, 2013, issued in U.S. Appl. No. 12/202,126.
U.S. Notice of Allowance, dated Mar. 12, 2003, issued in U.S. Appl. No. 09/975,074.
U.S. Notice of Allowance, dated Mar. 2, 2010, issued in U.S. Appl. No. 11/349,035.
U.S. Notice of Allowance, dated Mar. 2, 2012, issued in U.S. Appl. No. 12/556,490.
U.S. Notice of Allowance, dated Mar. 2, 2015, issued in U.S. Appl. No. 13/633,502.
U.S. Notice of Allowance, dated Mar. 24, 2017, issued in U.S. Appl. No. 13/851,885.
U.S. Notice of Allowance, dated May 23, 2014, issued in U.S. Appl. No. 13/633,798.
U.S. Notice of Allowance, dated May 4, 2009, issued in U.S. Appl. No. 11/265,531.
U.S. Notice of Allowance, dated May 4, 2017, issued in U.S. Appl. No. 14/723,275.
U.S. Notice of Allowance, dated Nov. 17, 2009, issued in U.S. Appl. No. 11/305,368.
U.S. Notice of Allowance, dated Nov. 18, 2016, issued in U.S. Appl. No. 14/723,270.
U.S. Notice of Allowance dated Nov. 29, 2012, issued in U.S. Appl. No. 13/244,016.
U.S. Notice of Allowance, dated Nov. 4, 2014, issued in U.S. Appl. No. 13/560,688.
U.S. Notice of Allowance, dated Oct. 13, 2016, issued in U.S. Appl. No. 14/738,685.
U.S. Notice of Allowance, dated Oct. 25, 2016, issued in U.S. Appl. No. 14/135,375.
U.S. Notice of Allowance, dated Oct. 4, 2012, issued in U.S. Appl. No. 13/276,170.
U.S. Notice of Allowance, dated Oct. 7, 2004, issued in U.S. Appl. No. 10/435,010.
U.S. Notice of Allowance, dated Sep. 14, 2005, issued in U.S. Appl. No. 10/690,492.
U.S. Notice of Allowance, dated Sep. 17, 2009, issued in U.S. Appl. No. 11/782,570.

(56) References Cited

OTHER PUBLICATIONS

U.S. Notice of Allowance, dated Sep. 19, 2011, issued in U.S. Appl. No. 12/407,541.
U.S. Notice of Allowance, dated Sep. 2, 2011, issued in U.S. Appl. No. 11/963,698.
U.S. Notice of Allowance, dated Sep. 25, 2015, issued in U.S. Appl. No. 14/502,817.
U.S. Notice of allowance dated Sep. 29, 2021 issued in U.S. Appl. No. 16/724,231.
U.S. Notice of Allowance, dated Sep. 30, 2011, issued in U.S. Appl. No. 12/636,616.
U.S. Notice of Allowance dated Sep. 4, 2013 issued in U.S. Appl. No. 12/755,259.
U.S. Notice of Allowance, dated Sep. 6, 2019, issued in U.S. Appl. No. 15/958,662.
U.S. Notice of Allowance, dated Sep. 9, 2015, issued in U.S. Appl. No. 14/097,160.
U.S. Notice of Allowance (Supplemental Notice of Allowability), dated Apr. 16, 2015, issued in U.S. Appl. No. 13/633,502.
U.S. Office Action, dated Apr. 16, 2012, issued in U.S. Appl. No. 13/276,170.
U.S. Office Action, dated Apr. 17, 2006, issued in U.S. Appl. No. 10/815,560.
U.S. Office Action, dated Apr. 19, 2012, issued in U.S. Appl. No. 12/829,119.
U.S. Office Action, dated Apr. 3, 2009, issued in U.S. Appl. No. 11/305,368.
U.S. Office Action, dated Apr. 4, 2019, issued in U.S. Appl. No. 15/958,662.
U.S. Office Action, dated Apr. 7, 2014, issued in U.S. Appl. No. 13/633,502.
U.S. Office Action, dated Aug. 21, 2008, issued in U.S. Appl. No. 11/265,531.
U.S. Office Action, dated Aug. 5, 2009, issued in U.S. Appl. No. 11/951,236.
U.S. Office Action, dated Aug. 6, 2012, issued in U.S. Appl. No. 13/095,734.
U.S. Office Action, dated Dec. 11, 2014, issued in U.S. Appl. No. 14/173,733.
U.S. Office Action dated Dec. 18, 2012, issued in U.S. Appl. No. 12/723,532.
U.S. Office Action, dated Dec. 18, 2014, issued in U.S. Appl. No. 14/097,160.
U.S. Office Action, dated Dec. 18, 2014, issued in U.S. Appl. No. 14/502,817.
U.S. Office Action, dated Dec. 23, 2014, issued in U.S. Appl. No. 13/851,885.
U.S. Office Action, dated Dec. 30, 2005, issued in U.S. Appl. No. 10/649,351.
U.S. Office Action, dated Feb. 1, 2016, issued in U.S. Appl. No. 14/723,275.
U.S. Office Action, dated Feb. 15, 2013, issued in U.S. Appl. No. 12/755,248.
U.S. Office Action, dated Feb. 16, 2012, issued in U.S. Appl. No. 12/755,259.
U.S. Office Action, dated Feb. 24, 2014, issued in U.S. Appl. No. 13/020,748.
U.S. Office Action, dated Feb. 8, 2005, issued in U.S. Appl. No. 10/649,351.
U.S. Office Action, dated Jan. 12, 2016, issued in U.S. Appl. No. 14/738,685.
U.S. Office Action, dated Jan. 21, 2016, issued in U.S. Appl. No. 14/135,375.
U.S. Office Action, dated Jan. 25, 2011, issued in U.S. Appl. No. 12/636,616.
U.S. Office Action, dated Jan. 7, 2013, issued in U.S. Appl. No. 12/202,126.
U.S. Office Action, dated Jul. 12, 2005, issued in U.S. Appl. No. 10/815,560.
U.S. Office Action, dated Jul. 12, 2016, issued in U.S. Appl. No. 14/723,270.
U.S. Office Action, dated Jul. 17, 2002, issued in U.S. Appl. No. 09/975,074.
U.S. Office Action dated Jul. 18, 2013, issued in U.S. Appl. No. 12/723,532.
U.S. Office Action, dated Jul. 20, 2017, issued in U.S. Appl. No. 15/398,462.
U.S. Office Action, dated Jul. 26, 2010 issued in U.S. Appl. No. 12/202,126.
U.S. Office Action, dated Jul. 28, 2016, issued in U.S. Appl. No. 14/723,275.
U.S. Office Action, dated Jul. 7, 2016, issued in U.S. Appl. No. 14/989,444.
U.S. Office Action, dated Jun. 11, 2009, issued in U.S. Appl. No. 11/963,698.
U.S. Office Action, dated Jun. 11, 2010, issued in U.S. Appl. No. 11/963,698.
U.S. Office Action, dated Jun. 14, 2011, issued in U.S. Appl. No. 12/556,490.
U.S. Office Action, dated Jun. 14, 2013, issued in U.S. Appl. No. 13/633,798.
U.S. Office Action, dated Jun. 20, 2013, issued in U.S. Appl. No. 13/560,688.
U.S. Office Action, dated Jun. 22, 2004, issued in U.S. Appl. No. 10/435,010.
U.S. Office Action, dated Jun. 24, 2009, issued in U.S. Appl. No. 12/030,645.
U.S. Office Action, dated Jun. 27, 2008, issued in U.S. Appl. No. 11/305,368.
U.S. Office Action, dated Jun. 30, 2011, issued in U.S. Appl. No. 12/829,119.
U.S. Office Action, dated Jun. 4, 2009, issued in U.S. Appl. No. 11/349,035.
U.S. Office Action, dated Mar. 23, 2005, issued in U.S. Appl. No. 10/690,492.
U.S. Office Action, dated Mar. 6, 2012, issued in U.S. Appl. No. 13/244,016.
U.S. Office Action, dated May 10, 2012, issued in U.S. Appl. No. 13/020,748.
U.S. Office Action, dated May 13, 2011, issued in U.S. Appl. No. 12/755,248.
U.S. Office Action, dated May 2, 2011, issued in U.S. Appl. No. 12/407,541.
U.S. Office Action, dated May 29, 2015, issued in U.S. Appl. No. 13/949,092.
U.S. Office Action, dated May 3, 2010, issued in U.S. Appl. No. 12/407,541.
U.S. Office Action, dated May 30, 2014, issued in U.S. Appl. No. 13/862,048.
U.S. Office Action, dated May 6, 2015, issued in U.S. Appl. No. 14/135,375.
U.S. Office Action, dated Nov. 23, 2005, issued in U.S. Appl. No. 10/984,126.
U.S. Office Action, dated Nov. 23, 2010, issued in U.S. Appl. No. 12/538,770.
U.S. Office Action, dated Oct. 16, 2008, issued in U.S. Appl. No. 11/349,035.
U.S. Office Action dated Oct. 21, 2009, issued in U.S. Appl. No. 12/202,126.
U.S. Office Action, dated Oct. 24, 2018, issued in U.S. Appl. No. 15/415,800.
U.S. Office Action, dated Oct. 28, 2011, issued in U.S. Appl. No. 12/755,248.
U.S. Office Action, dated Sep. 11, 2017, issued in U.S. Appl. No. 14/965,806.
U.S. Office Action, dated Sep. 18, 2014, issued in U.S. Appl. No. 13/928,216.
U.S. Office Action, dated Sep. 19, 2016, issued in U.S. Appl. No. 13/949,092.
U.S. Office Action, dated Sep. 2, 2016, issued in U.S. Appl. No. 14/965,806.

(56) References Cited

OTHER PUBLICATIONS

U.S. Office Action dated Sep. 22, 2020 issued in U.S. Appl. No. 16/724,231.
U.S. Office Action, dated Sep. 28, 2006, issued in U.S. Appl. No. 10/815,560.
U.S. Office Action, dated Sep. 29, 2008, issued in U.S. Appl. No. 11/782,570.
U.S. Appl. No. 17/294,378, inventors van Cleemput et al., filed May 14, 2021.
U.S. Appl. No. 17/310,293, inventors Collins et al., filed Jul. 27, 2021.
U.S. Appl. No. 17/436,944, inventors Blakeney et al., filed Sep. 7, 2021.
U.S. Appl. No. 13/758,928, Inventors Humayun et al.,filed Feb. 4, 2013.
U.S. Appl. No. 17/601,918, Inventors Bowes et al., filed Oct. 6, 2021.
Wikipedia "Atomic layer deposition" [webpage] Mar. 25, 2020, pp. 1-9. retrieved from, URL: https://ja.wikipedia.org/w/index.php?title=Atomic Layer Deposition & oldid=76757564.
Co-pending U.S. Appl. No. 17/639,846, inventor Na; Jeong-Seok, filed Mar. 2, 2022.
International Preliminary Report on Patentability dated Mar. 10, 2022, in Application No. PCT/US2020/070434.
International Search Report and Written Opinion dated Feb. 3, 2021, in Application No. PCT/US2020/055596.
International Preliminary Report on Patentability dated Feb. 24, 2022 in PCT Application No. PCT/US2020/070394.
International Search Report and Written Opinion dated Dec. 4, 2020, in PCT Application No. PCT/US2020/048951.
International Search Report and Written Opinion dated Nov. 27, 2020, in PCT Application No. PCT/US2020/070394.
JP Office Action dated Nov. 24, 2021, in Application No. JP20160104837 with English translation.
Kim, S. et al., "Effects of $B_2H_6$ Pretreatment on ALD of W Film Using a Sequential Supply of $WF_6$ and $SiH_4$", Electrochemical and Solid-State Letters, The Electrochemical Society, 2005, vol. 8, No. 10, pp. C155-C159.
KR Office Action dated Dec. 14, 2021, in application No. 20210063953 with English translation.
KR Office Action dated Feb. 21, 2022, in Application No. KR10-2017-0102113.
KR Office Action dated Feb. 16, 2022, in Application No. KR1020160064157 with English translation.
KR Office Action dated Jan. 11, 2022, in KR Application No. 10-2022-0000825 with English translation.
U.S. Corrected Notice of Allowance dated Feb. 16, 2022, in U.S. Appl. No. 16/724,231.
U.S. Final Office Action dated Jan. 31, 2022 in U.S. Appl. No. 16/764,812.
U.S. Non-Final Office Action dated Sep. 21, 2021, in U.S. Appl. No. 16/638,430.
U.S. Notice of Allowance dated Feb. 2, 2022 in U.S. Appl. No. 16/724,231.
U.S. Notice of Allowance dated Jan. 25, 2022, in U.S. Appl. No. 16/638,430.
U.S. Appl. No. 17/639,846, inventors Na Jeong-Seok et al., filed Mar. 2, 2022.
Chiu, H. et al., "Deposition of Molybdenum Carbonitride Thin Films from $Mo(NBu^t)_2(NHBu^t)_2$", J. Mater. Res, Jul. 1994, vol. 9, No. 7, pp. 1622-1624.
Co-pending U.S. Appl. No. 17/633,562, filed Jul. 2, 2022.
Co-pending U.S. pending U.S. Appl. No. 17/763,529, filed Mar. 24, 2022.
International Preliminary Report on Patentability dated Mar. 3, 2022, in Application No. PCT/US2020/070390.
International Search Report and Written Opinion dated Jun. 9, 2022 in International Application No. PCT/US2022/01700.
International Preliminary Report on Patentability dated Apr. 28, 2022, in PCT Application No. PCT/US2020/055596.
International Preliminary Report on Patentability dated Dec. 2, 2021, issued in PCT/US2020/033461.
International Preliminary Report on Patentability dated Mar. 17, 2022 in PCT Application No. PCT/US2020/048951.
International Search Report and Written Opinion dated Feb. 4, 2021, in PCT Application No. PCT/US2020/070390.
International Search Report and Written Opinion dated Sep. 4, 2020 in PCT Application No. PCT/US2020/033461.
JP Office Action dated Apr. 19, 2022 in Application No. JP20200504286 with English translation.
JP Office Action dated May 31, 2022, in Application No. JP2016-104837 with English translation.
KR Office Action dated Apr. 19, 2022, in application No. KR20140184759 with English Translation.
KR Office Action dated Feb. 21, 2022, in Application No. KR10-2017-0102113 with English Translation.
KR Office Action dated Jun. 23, 2022, in Application No. KR10-2022-0015236.
KR Office action dated May 25, 2022, in Application No. KR20210063953 with English Translation.
KR Office Action dated May 30, 2022, in Application No. KR10-2019-7033130 With English Translation.
Lin, S. et al., "Effect of Nitrogen on the Physical Properties and work Function of $MoN_u$ Cap Layers on $HfO_2$ Gate Dielectrics", ECS Journal of Solid State Science and Technology, 2014, vol. 3, No. 12, pp. N161-N165.
Miikkulainen, V. et al., "Atomic Layer Deposition of Molybdenum Nitride from Bis(tert-butylimido)-bis(dimethylamido)molybdenum and Ammonia onto Several Types of Substrate Materials with Equal Growth per Cycle", Chemistry of Materials, 2007, vol. 19, pp. 263-269.
Miikkulainen, V. et al., "Bis(tert-butylimido)-bis(dialkylamido) Complexes of Molybdenum as Atomic Layer Deposition (ALD) Precursors for Molybdenum Nitride: the Effect of the Alkyl Group", Chemical Vapor Deposition, 2008, vol. 14, pp. 71-77.
Mohimi, E, et al., "Low temperature chemical vapor deposition of superconducting molybdenum carbonitride thin films", Journal of Vacuum Science & Technology A , 2019, vol. 37, No. 2, 021503, 6 pages.
Nandi, D.K. et al., "Atomic Layer Deposited Molybdenum Nitride Thin Film: A Promising Anode Material for Li Ion Batteries", ACS Applied Material Interfaces, 2014, vol. 6, pp. 6606-6615.
Ranade, P. et al., "Work Function Engineering of Molybdenum Gate Electrodes by Nitrogen Implantation", Electrochemical and Solid-State Letters, 2001, vol. 4, No. 11, pp. G85-G87.
Shimizu, H. et al., "Precursor-based designs of nano-structures and their processing forCo(W) alloy films as a single layered barrier/liner layer in future Cu-interconnect", Journal of Materials Chemistry C, 2015, vol. 3, pp. 2500-2510.
TW Office Action dated Aug. 16, 2022, in Application No. TW107141042.
TW Office Action dated Feb. 21, 2022, in Application No. TW107128141 with English translation.
TW Office Action dated May 24, 2022, in Application No. TW20180112210 with English translation.
U.S Advisory Action dated May 3, 2022 in U.S. Appl. No. 16/764,812.
U.S. Corrected Notice of Allowance dated May 5, 2022 in U.S. Appl. No. 16/638,430.
U.S. Corrected Notice of Allowance dated May 11, 2022, in U.S. Appl. No. 16/724,231.
U.S. Final office Action dated Jul. 25, 2022 in U.S. Appl. No. 17/250,452.
U.S. Non Final Office Action dated Mar. 21, 2022, in U.S. Appl. No. 17/250,452.
U.S. Non-Final Office Action dated Jun. 24, 2022, in U.S. Appl. No. 17/436,944.
U.S. Non-Final Office Action dated May 16, 2022 in U.S. Appl. No. 16/764,812.
U.S. Appl. No. 17/753,042, filed Feb. 16, 2022.
U.S. Appl. No. 17/814,206, inventors Collins et al., filed Jul. 21, 2022.
U.S. Appl. No. 17/814,207, inventors Thombare et al., filed Jul. 21, 2022.

(56) References Cited

OTHER PUBLICATIONS

U.S. Appl. No. 17/814,209, inventors Cleemput et al., filed Jul. 21, 2022.
CN Office Action dated Nov. 17, 2022, in Application No. CN202080011300.3 with English translation.
CN Office Action dated Oct. 11, 2022, in Application No. CN201910418672.7 with English translation.
International Preliminary Report on Patentability and written opinion dated Sep. 15, 2022, in PCT Application No. PCT/US2021/020748.
International Search Report and Written Opinion dated Sep. 7, 2022 in Application No. PCT/US2022/028845.
KR Office Action dated Sep. 27, 2022, in Application No. KR10-2017-0102113.
TW Office Action dated Sep. 14, 2022, in Application No. TW107112210 with English translation.
U.S. Advisory Action dated Oct. 18, 2022, in U.S. Appl. No. 17/250,452.
U.S. Final Office Action dated Nov. 30, 2022 in U.S. Appl. No. 16/764,812.
U.S. Non-Final Office Action dated Nov. 30, 2022 in U.S. Appl. No. 17/814,207.

\* cited by examiner

FIG. 1B  FIG. 1C

METHOD OF DEPOSITING TUNGSTEN AND OTHER METALS IN 3D NAND STRUCTURES

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Deposition of tungsten-containing materials is an integral part of many semiconductor fabrication processes. These materials may be used for horizontal interconnects, vias between adjacent metal layers, and contacts between metal layers and devices. In a conventional tungsten deposition process, the substrate is heated to the process temperature in a vacuum chamber and a very thin portion of tungsten film that serves as a seed layer (also called a nucleation layer) is deposited. Thereafter, the remainder of the tungsten film (referred to as the bulk layer) is deposited on the nucleation layer by exposing the substrate to two reactants simultaneously in a chemical vapor deposition (CVD) process. The bulk layer is generally deposited more rapidly than the nucleation layer. However, as devices shrink and more complex patterning schemes are utilized in the industry, deposition of thin tungsten films becomes a challenge. Deposition in complex high aspect ratio structures such as 3D NAND structures is particularly challenging.

SUMMARY

Provided herein are methods and apparatuses for filling features with metal-containing materials. One aspect of the disclosure relates to a method for filling structures with a metal-containing material, the method including: providing a structure to be filled with a metal-containing material, exposing the structure to multiple deposition cycles, with each deposition cycle including exposure to one or more alternating reducing agent (e.g. hydrogen ($H_2$)) dose/inert gas purge pulses pulse followed by exposure to one or more alternating metal precursor dose pulses and inert gas purge pulses. The metal may be tungsten (W) or molybdenum (Mo) in some embodiments.

In some embodiments, the structure is a partially fabricated three-dimension (3-D) NAND structure having sidewalls and a plurality of openings in the sidewalls leading to a plurality of features having a plurality of interior regions fluidically accessible through the openings. In some embodiments, the metal precursor is a chlorine-containing metal precursor, such as tungsten hexachloride, tungsten pentachloride, tungsten tetrachhloride, molybdenum pentachloride, molybdenum dichloride dioxide, and molybdenum tetrachloride oxide, and mixtures thereof. In some embodiments, a pulse of the chlorine-containing metal precursor comprises between about 0.1% and about 5.0% of chlorine-containing metal precursor by volume. In some embodiments, the exposure to multiple alternating metal precursor pulses and inert gas purge pulses includes turning the inert gas purge flow off during the metal precursor pulses. In some embodiments, the duration of an inert gas purge pulse is at least 1.5 times that of a metal precursor pulse. In some embodiments, each deposition cycle comprises at least five or at least ten alternating metal precursor pulses and inert gas purge pulses. In some embodiments, each deposition cycle includes only one $H_2$ pulse. In other embodiments, each deposition cycle includes multiple alternating $H_2$ and inert gas pulses.

Another aspect of the disclosure relates to a method for filling structures with a metal-containing material, the method including: providing a structure to be filled with a metal-containing material, exposing the structure to multiple deposition cycles, with each deposition cycle including exposure to a reducing agent (e.g. hydrogen ($H_2$)) dose pulse followed by exposure to an inert gas pulse and exposure to multiple alternating metal precursor dose pulses and inert gas purge pulses. In some embodiments, the structure is a partially fabricated three-dimension (3-D) NAND structure having sidewalls and a plurality of openings in the sidewalls leading to a plurality of features having a plurality of interior regions fluidically accessible through the openings. In some embodiments, the metal precursor is a chlorine-containing metal precursor, such as tungsten hexachloride, tungsten pentachloride, tungsten tetrachhloride, molybdenum pentachloride, molybdenum dichloride dioxide, and molybdenum tetrachloride oxide, and mixtures thereof. In some embodiments, a pulse of the chlorine-containing metal precursor comprises between about 0.1% and about 5.0% of chlorine-containing metal precursor by volume. In some embodiments, the exposure to multiple alternating metal precursor pulses and inert gas purge pulses includes turning the inert gas purge flow off during the metal precursor pulses. In some embodiments, the duration of an inert gas purge pulse is at least 1.5 times that of a metal precursor pulse. In some embodiments, each deposition cycle comprises at least five or at least ten alternating metal precursor pulses and inert gas purge pulses.

Another aspect of the disclosure relates to an apparatus including one or more process chambers each configured to hold a substrate; one or more process gas inlets for coupling to a reducing agent (e.g., hydrogen ($H_2$)) gas source, a metal precursor gas source, and an inert purge gas source; and a controller for controlling operations in the apparatus, comprising machine-readable instructions for performing multiple deposition cycles, wherein each deposition cycle comprises: inletting a hydrogen ($H_2$) pulse to the one or more process chambers via the one more process gas inlets; after inletting the $H_2$ pulse, inletting an inert purge gas pulse to the one or more process chamber via the one or more process gas inlets; after inletting the inert purge gas pulse, inletting multiple alternating metal precursor pulses and inert gas purge pulses to the one or more process chambers via the one or more purge gas inlets. In some embodiments, the metal precursor is a chlorine-containing metal precursor. In some embodiments, the instructions comprise instructions for turning the inert gas purge flow off during the metal precursor pulses. In some embodiments, the duration of the inert gas purge pulse is at least 1.5 times that of the metal precursor pulses. In some embodiments, each deposition cycle comprises at least five alternating metal precursor pulses and inert gas purge pulses. In some embodiments, each deposition cycle comprises at least ten alternating metal precursor pulses and inert gas purge pulses.

Another aspect of the disclosure relates to a method for filling structures with a metal-containing material, the method including: providing a structure to be filled with a metal-containing material, exposing the structure to multiple deposition cycles, with each deposition cycle including exposure to multiple alternating hydrogen ($H_2$) pulses and inert gas pulses followed and exposure to metal precursor pulse followed by an inert gas purge pulse. In some embodiments, the structure is a partially fabricated three-dimension (3-D) NAND structure having sidewalls and a plurality of openings in the sidewalls leading to a plurality of features having a plurality of interior regions fluidically accessible through the openings. In some embodiments, the metal precursor is a chlorine-containing metal precursor. In some embodiments, a pulse of the chlorine-containing metal precursor comprises between about 0.1% and about 5.0% of chlorine-containing metal precursor by volume. In some embodiments, the exposure to multiple alternating $H_2$ pulses and inert gas purge pulses includes turning the inert gas purge flow off during the metal precursor pulses. In some embodiments, each deposition cycle includes only one metal precursor pulse. In other embodiments, each deposition cycle includes multiple alternating metal precursor and inert gas pulses.

Another aspect of the disclosure relates to an apparatus including one or more process chambers each configured to hold a substrate; one or more process gas inlets for coupling to a hydrogen ($H_2$) gas source, a metal precursor gas source, and an inert purge gas source; and a controller for controlling operations in the apparatus, comprising machine-readable instructions for performing multiple deposition cycles, wherein each deposition cycle comprises: inletting multiple alternating $H_2$ pulses and inert gas purge pulses to the one or more process chambers via the one or more purge gas inlets, and inletting a metal precursor pulse followed by an inert gas pulse. In some embodiments, the metal precursor is a chlorine-containing metal precursor. In some embodiments, the instructions comprise instructions for turning the inert gas purge flow off during the $H_2$ pulses.

These and other aspects are described further below with reference to the drawings.

BRIEF DESCRIPTION OF THE DRAWINGS

FIGS. 1B-1J are schematic examples of various structures in which tungsten or molybdenum may be deposited in accordance with certain disclosed embodiments.

DETAILED DESCRIPTION

Figure 1A:
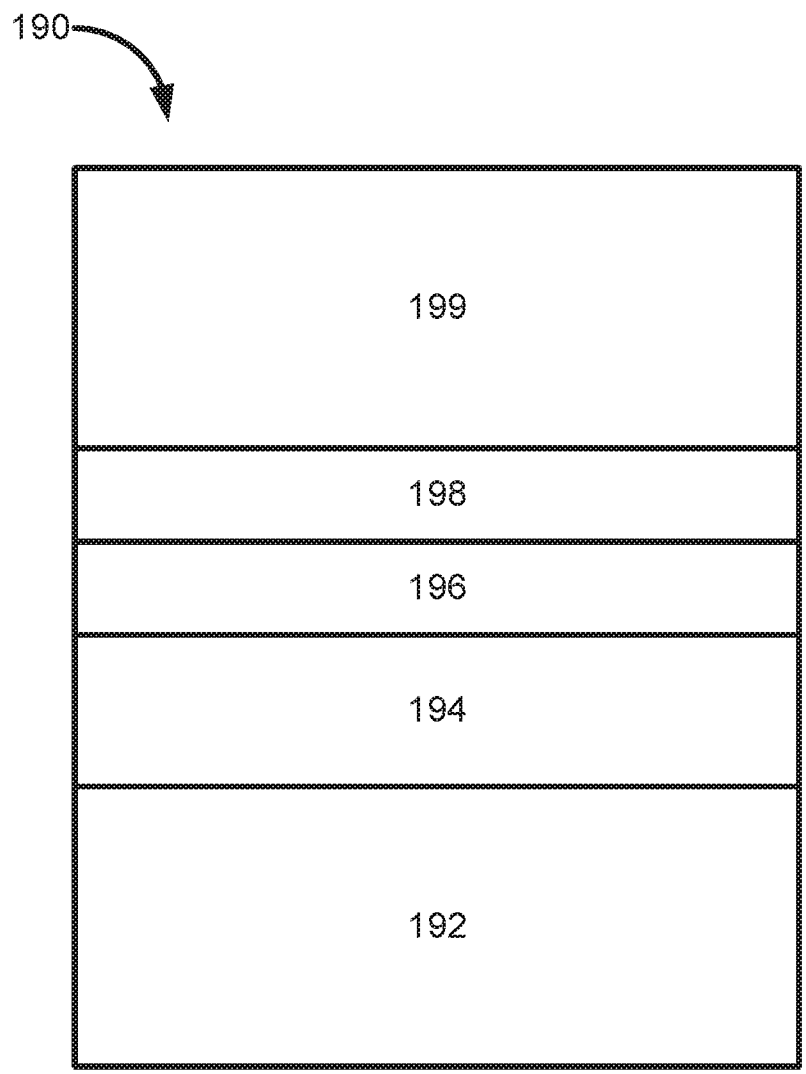
FIG. 1A is a schematic illustration of example films on a substrate.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Tungsten (W) fill of features is often used in semiconductor device fabrication to form electrical contacts. In conventional methods of depositing tungsten films, a nucleation tungsten layer is first deposited into a via or contact. In general, a nucleation layer is a thin conformal layer that serves to facilitate the subsequent formation of a bulk material thereon. The tungsten nucleation layer may be deposited to conformally coat the sidewalls and bottom of the feature. Conforming to the underlying feature bottom and sidewalls can be critical to support high quality deposition. Nucleation layers are often deposited using atomic layer deposition (ALD) or pulsed nucleation layer (PNL) methods.

In a PNL technique, pulses of reactant are sequentially injected and purged from the reaction chamber, typically by a pulse of a purge gas between reactants. A first reactant can be adsorbed onto the substrate, available to react with the next reactant. The process is repeated in a cyclical fashion until the desired thickness is achieved. PNL techniques are similar to ALD techniques. PNL is generally distinguished from ALD by its higher operating pressure range (greater than 1 Torr) and its higher growth rate per cycle (greater than 1 monolayer film growth per cycle). Chamber pressure during PNL deposition may range from about 1 Torr to about 400 Torr. In the context of the description provided herein, PNL broadly embodies any cyclical process of sequentially adding reactants for reaction on a semiconductor substrate. Thus, the concept embodies techniques conventionally referred to as ALD. In the context of the disclosed embodiments, chemical vapor deposition (CVD) embodies processes in which reactants are together introduced to a reactor for a vapor-phase or surface reaction. PNL and ALD processes are distinct from CVD processes and vice versa.

After the tungsten nucleation layer is deposited, bulk tungsten is typically deposited by a CVD process by reducing tungsten hexafluoride ($WF_6$) using a reducing agent such as hydrogen ($H_2$). Bulk tungsten is different from a tungsten nucleation layer. Bulk tungsten as used herein refers to tungsten used to fill most or all of a feature, such as at least about 50% of the feature. Unlike a nucleation layer, which is a thin conformal film that serves to facilitate the subsequent formation of a bulk material thereon, bulk tungsten is used to carry current. It may be characterized by larger grain size and lower resistivity as compared to a nucleation film. In various embodiments, bulk tungsten is tungsten deposited to a thickness of at least 50 Å.

There are various challenges in tungsten fill as devices scale to smaller technology nodes and more complex patterning structures are used. Conventional deposition of tungsten has involved the use of the fluorine-containing precursor tungsten hexafluoride ($WF_6$). However, the use of $WF_6$ results in some incorporation of fluorine into the deposited tungsten film. The presence of fluorine can cause electromigration and/or fluorine diffusion into adjacent components and damage contacts, thereby reducing the performance of the device. One challenge is reducing the fluorine content in a deposited tungsten film. The effect of a certain fluorine concentration increases as feature size decreases. This is because thinner films are deposited in smaller features with fluorine in the deposited tungsten film more likely to diffuse through thinner films.

One method of preventing fluorine diffusion includes depositing one or more barrier layers prior to depositing tungsten to prevent fluorine from diffusing from tungsten to other layers of the substrate such as an oxide layer. For example, FIG. 1A shows an example stack of layers deposited on a substrate. Substrate 190 includes a silicon layer 192, an oxide layer 194 (e.g., titanium oxide (TiOx), tetraethyl orthosilicate (TEOS) oxide, etc.), a barrier layer 196 (e.g., titanium nitride (TiN)), a tungsten nucleation layer 198, and a bulk tungsten layer 199. Barrier layer 196 is deposited to prevent fluorine diffusion from the bulk tungsten layer 199 and the tungsten nucleation layer 198 to the oxide layer. However, as devices shrink, barrier layers become thinner, and fluorine may still diffuse from the deposited tungsten layers. Although chemical vapor deposition of bulk tungsten performed at a higher temperature results in lower fluorine content, such films may have poor step coverage.

Another challenge is reducing stress on deposited films. Thinner tungsten films tend to have increased tensile stress. Conventional techniques for depositing bulk tungsten films by chemical vapor deposition have a tensile stress greater than 2.5 GPa for a 200 Å film. High thermal tensile stress causes the substrate to curl, which makes subsequent processing difficult. For example, subsequent processes may include chemical mechanical planarization, deposition of materials, and/or clamping of the substrate to a substrate holder to perform processes in a chamber. However, these processes often rely on the substrate being flat, and a curled substrate results in non-uniform processing or inability to process the substrate. Although there are existing methods for reducing stress in films of other materials such as annealing, tungsten does not have the surface mobility to allow grains to be moved or altered once it is deposited due to its high melting point.

Fluorine-free tungsten (FFW) precursors are useful to prevent such reliability and integration issues or device performance issues. Current FFW precursors include metal organic precursors, but undesirable traces of elements from the metal organic precursors may be incorporated in the tungsten film as well, such as carbon, hydrogen, nitrogen, and oxygen. Some metal organic fluorine-free precursors are also not easily implemented or integrated in tungsten deposition processes.

Some implementations described herein relate to deposition of tungsten using a tungsten chloride ($WCl_x$) precursor. Tungsten chloride includes tungsten pentachloride ($WCl_5$), tungsten hexachloride ($WCl_6$), tungsten tetrachloride ($WCl_4$), tungsten dichloride ($WCl_2$), and mixtures thereof. Although examples herein refer to $WCl_5$ and $WCl_6$ as examples, it is understood that other tungsten chlorides may be used with disclosed embodiments. Films deposited using certain disclosed embodiments are fluorine-free. Certain disclosed embodiments are directed to depositing bulk tungsten using alternating pulses of a chlorine-containing tungsten precursor and hydrogen.

Deposition by $WCl_5$ and $WCl_6$ presents challenges that are not present with $WF_6$, due to possible etching by the tungsten chlorides. Tungsten chlorides are less reactive, and as a result, deposition is performed at higher temperature than deposition using $WF_6$. Evaporated $WCl_6$ has a high enough vapor pressure to enable carrying it into the tungsten deposition chamber. However, $WCl_6$ may be more likely to etch the substrate than $WCl_5$. While $WCl_5$ is less likely to etch the substrate, $WCl_5$ also has a higher vapor pressure than $WCl_6$. Although the lower vapor pressure is useful in depositing tungsten films having low resistivity, some deposition operations may have poor step coverage.

The methods described herein may also be used for deposition of molybdenum (Mo) by molybdenum chloride or molybdenum oxychloride precursors. Molybdenum may be used to form low resistance metallization stack structures and may take the place of tungsten.

The disclosed embodiments have a wide variety of applications. Methods may be used to deposit tungsten or molybdenum into features with high step coverage, and may also be used to deposit tungsten into 3D NAND structures.

The methods described herein are performed on a substrate that may be housed in a chamber. The substrate may be a silicon or other semiconductor wafer, e.g., a 200-mm wafer, a 300-mm wafer, or a 450-mm wafer, including wafers having one or more layers of material, such as dielectric, conducting, or semi-conducting material deposited thereon. The methods are not limit to semiconductor substrates, and may be performed to fill any feature with metal such as tungsten.

Substrates may have features such as via or contact holes, which may be characterized by one or more of narrow and/or re-entrant openings, constrictions within the feature, and high aspect ratios. A feature may be formed in one or more of the above described layers. For example, the feature may be formed at least partially in a dielectric layer. In some embodiments, a feature may have an aspect ratio of at least about 2:1, at least about 4:1, at least about 6:1, at least about 10:1, at least about 25:1, or higher. One example of a feature is a hole or via in a semiconductor substrate or a layer on the substrate.

FIGS. 1B-1H are schematic examples of various structures in which a metal may be deposited in accordance with disclosed embodiments. FIG. 1B shows an example of a cross-sectional depiction of a vertical feature 101 to be filled with a metal, such as tungsten or molybdenum. The feature can include a feature hole 105 in a substrate 103. The hole 105 or other feature may have a dimension near the opening, e.g., an opening diameter or line width of between about 10 nm to 500 nm, for example between about 25 nm and about 300 nm. The feature hole 105 can be referred to as an unfilled feature or simply a feature. The feature 101, and any feature, may be characterized in part by an axis 118 that extends through the length of the feature, with vertically-oriented features having vertical axes and horizontally-oriented features having horizontal axes.

In some embodiments, features are wordline features in a 3D NAND structure. For example, a substrate may include a wordline structure having an arbitrary number of wordlines (e.g., 50 to 150) with vertical channels at least 200 Å deep. Another example is a trench in a substrate or layer. Features may be of any depth. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

FIG. 1C shows an example of a feature 101 that has a re-entrant profile. A re-entrant profile is a profile that narrows from a bottom, closed end, or interior of the feature to the feature opening. According to various implementations, the profile may narrow gradually and/or include an overhang at the feature opening. FIG. 1C shows an example of the latter, with an under-layer 113 lining the sidewall or interior surfaces of the feature hole 105. The under-layer 113 can be for example, a diffusion barrier layer, an adhesion layer, a nucleation layer, a combination of thereof, or any other applicable material. Non-limiting examples of under-layers can include dielectric layers and conducting layers, e.g., silicon oxides, silicon nitrides, silicon carbides, metal oxides, metal nitrides, metal carbides, and metal layers. In particular implementations an under-layer can be one or more of titanium, titanium nitride, tungsten nitride, titanium aluminide, tungsten, and molybdenum. In some embodiments, the under-layer is tungsten-free. In some embodiments, the under-layer is molybdenum-free. The under-layer 113 forms an overhang 115 such that the under-layer 113 is thicker near the opening of the feature 101 than inside the feature 101.

Figure 1E:
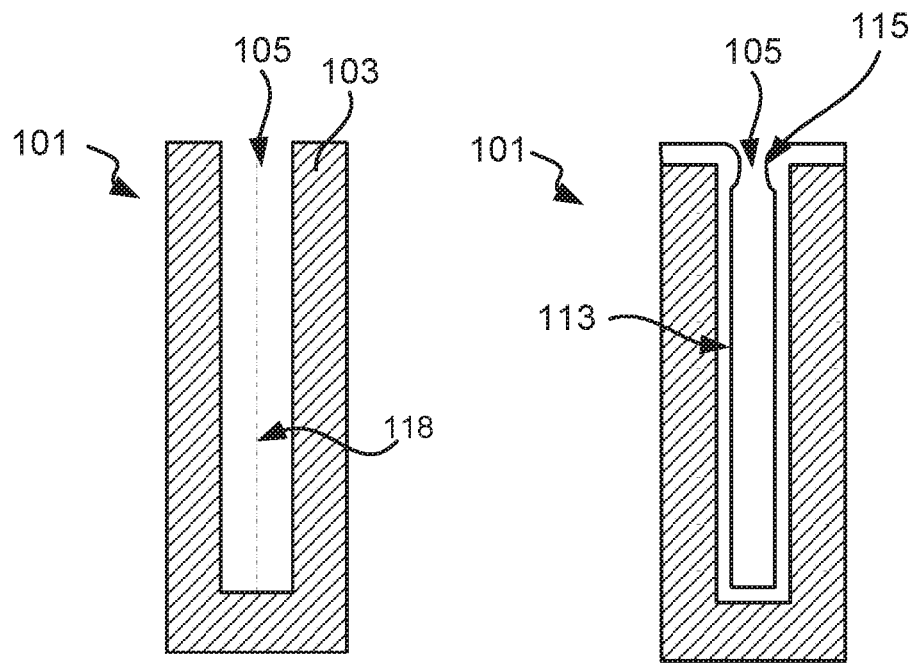
Figure 1E:
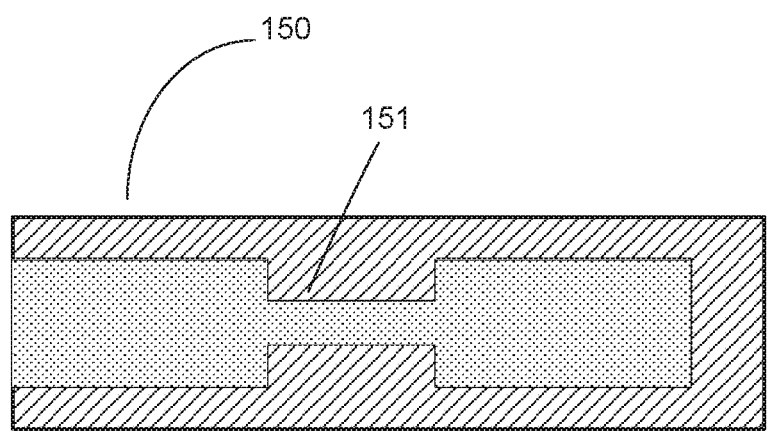
Figure 1D:
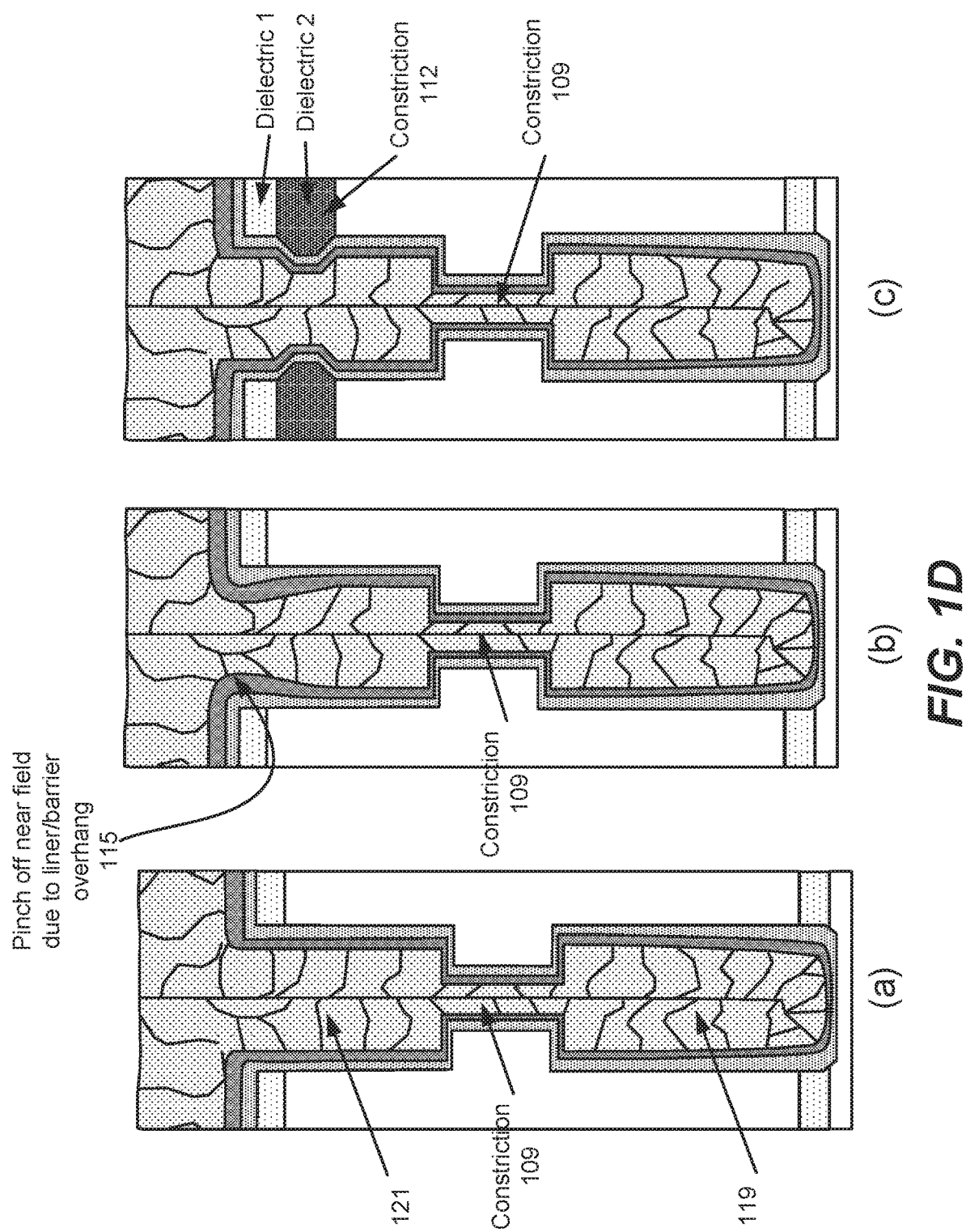

In some implementations, features having one or more constrictions within the feature may be filled. FIG. 1D shows examples of views of various filled features having constrictions. Each of the examples (a), (b) and (c) in FIG. 1D includes a constriction 109 at a midpoint within the feature. The constriction 109 can be, for example, between about 15 nm-20 nm wide. Constrictions can cause pinch off during deposition of tungsten or molybdenum in the feature using conventional techniques, with deposited metal blocking further deposition past the constriction before that portion of the feature is filled, resulting in voids in the feature. Example (b) further includes a liner/barrier overhang 115 at the feature opening. Such an overhang could also be a potential pinch-off point. Example (c) includes a constriction 112 further away from the field region than the overhang 115 in example (b).

Figure 1F:
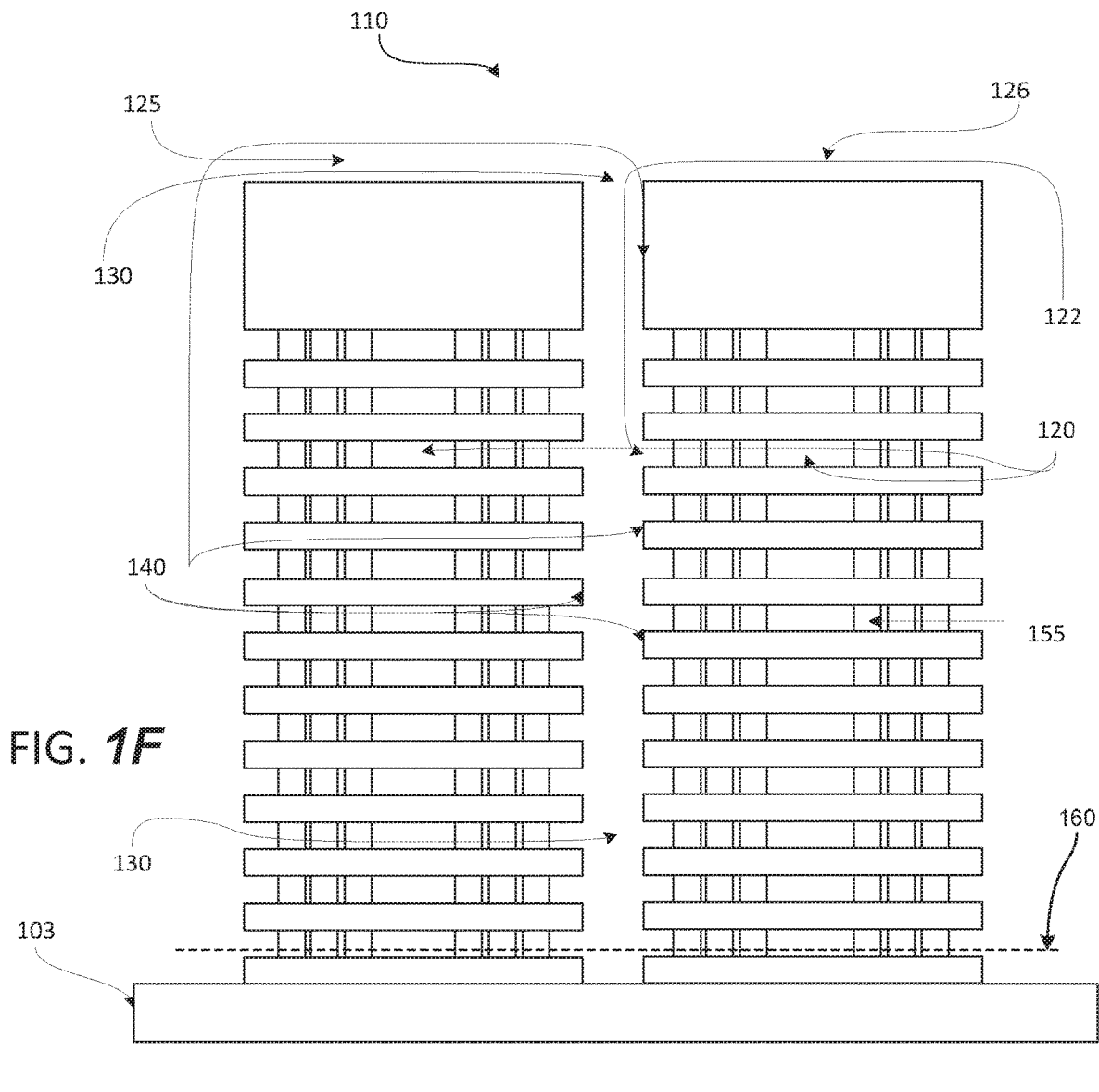

Horizontal features, such as in 3-D memory structures, can also be filled. FIG. 1E shows an example of a horizontal feature 150 that includes a constriction 151. For example, horizontal feature 150 may be a word line in a 3D NAND structure. In some implementations, the constrictions can be due to the presence of pillars in a 3D NAND or other structure. For instance, FIG. 1F presents a cross-sectional side-view of a 3-D NAND (also referred to as vertical NAND or VNAND) structure 110 (formed on a semiconductor substrate 103) having VNAND stacks (left 125 and right 126), central vertical structure 130, and a plurality of stacked horizontal features 120 with openings 122 on opposite sidewalls 140 of central vertical structure 130. Note that FIG. 1F displays two "stacks" of the exhibited 3-D NAND structure 110, which together form the "trench-like" central vertical structure 130, however, in certain embodiments, there may be more than two "stacks" arranged in sequence and running spatially parallel to one another, the gap between each adjacent pair of "stacks" forming a central vertical structure 130, like that explicitly illustrated in FIG. 1F. In this embodiment, the horizontal features 120 are 3-D memory wordline features that are fluidically accessible from the central vertical structure 130 through the openings 122. Although not explicitly indicated in the figure, the horizontal features 120 present in both the 3-D NAND stacks 125 and 126 shown in FIG. 1F (i.e., the left 3-D NAND stack 125 and the right 3-D NAND stack 126) are also accessible from the other sides of the stacks (far left and far right, respectively) through similar vertical structures formed by additional 3-D NAND stacks (to the far left and far right, but not shown). In other words, each 3-D NAND stack 125, 126 contains a stack of wordline features that are fluidically accessible from both sides of the 3-D NAND stack through a central vertical structure 130. In the particular example schematically illustrated in FIG. 1F, each 3-D NAND stack contains 6 pairs of stacked wordlines, however, in other embodiments, a 3-D NAND memory layout may contain any number of vertically stacked pairs of wordlines.

The wordline features in a 3-D NAND stack are typically formed by depositing an alternating stack of silicon oxide and silicon nitride layers, and then selectively removing the nitride layers leaving a stack of oxides layers having gaps between them. These gaps are the wordline features. Any number of wordlines may be vertically stacked in such a 3-D NAND structure so long as there is a technique for forming them available, as well as a technique available to successfully accomplish (substantially) void-free fills of the vertical features. Thus, for example, a VNAND stack may include between 2 and 256 horizontal wordline features, or between 8 and 128 horizontal wordline features, or between 16 and 64 horizontal wordline features, and so forth (the listed ranges understood to include the recited end points).

Figure 1G:
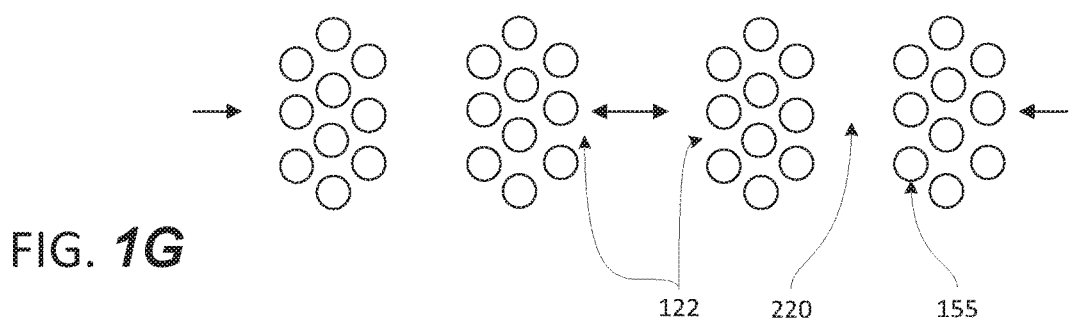

FIG. 1G presents a cross-sectional top-down view of the same 3-D NAND structure 110 shown in side-view in FIG. 1F with the cross-section taken through the horizontal section 160 as indicated by the dashed horizontal line in FIG. 1F. The cross-section of FIG. 1G illustrates several rows of pillars 155, which are shown in FIG. 1F to run vertically from the base of semiconductor substrate 103 to the top of 3-D NAND stack 110. In some embodiments, these pillars 155 are formed from a polysilicon material and are structurally and functionally significant to the 3-D NAND structure 110. In some embodiments, such polysilicon pillars may serve as gate electrodes for stacked memory cells formed within the pillars. The top-view of FIG. 1G illustrates that the pillars 155 form constrictions in the openings 122 to wordline features 120—i.e. fluidic accessibility of wordline features 120 from the central vertical structure 130 via openings 122 (as indicated by the arrows in FIG. 1G) is inhibited by pillars 155. In some embodiments, the size of the horizontal gap between adjacent polysilicon pillars is between about 1 and 20 nm. This reduction in fluidic accessibility increases the difficulty of uniformly filling wordline features 120 with tungsten material. The structure of wordline features 1 and the challenge of uniformly filling them with tungsten material or molybdenum material due to the presence of pillars 155 is further illustrated in FIGS. 1H, 1I, and 1J.

Figure 1H:
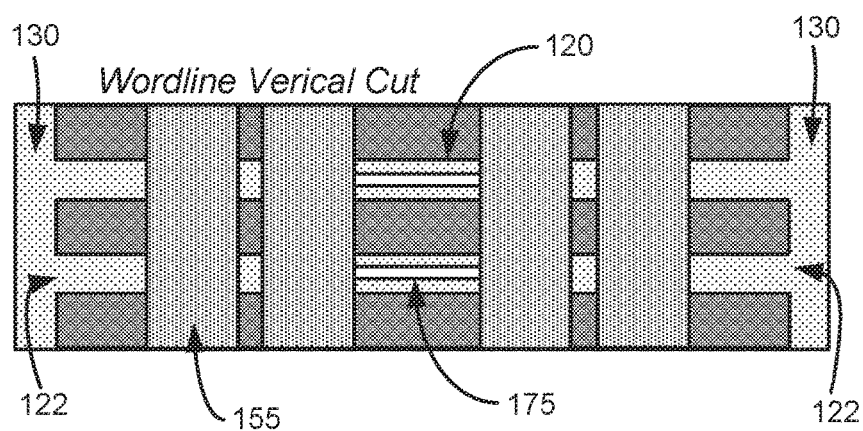
Figure 1I:
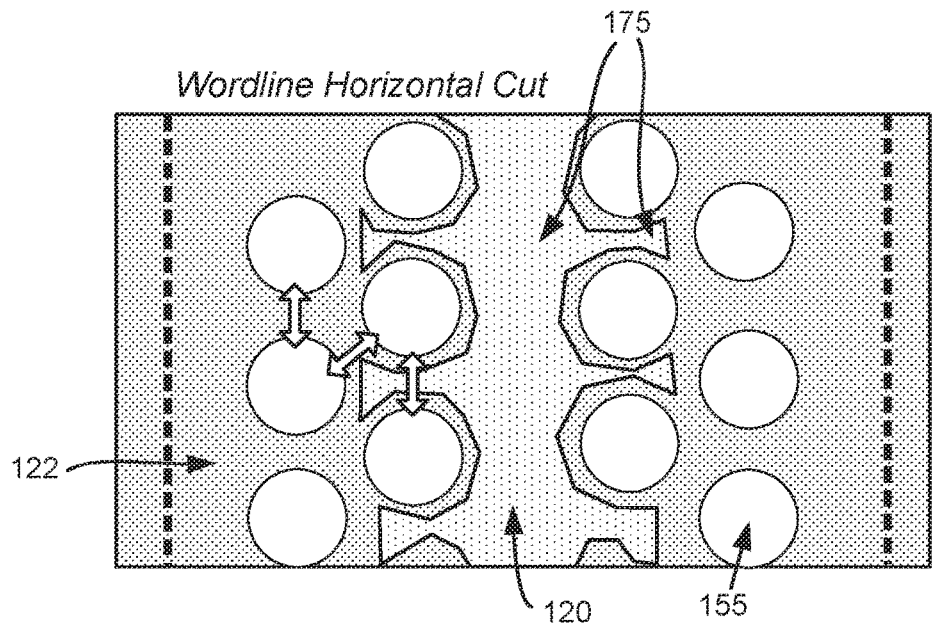
Figure 1J:
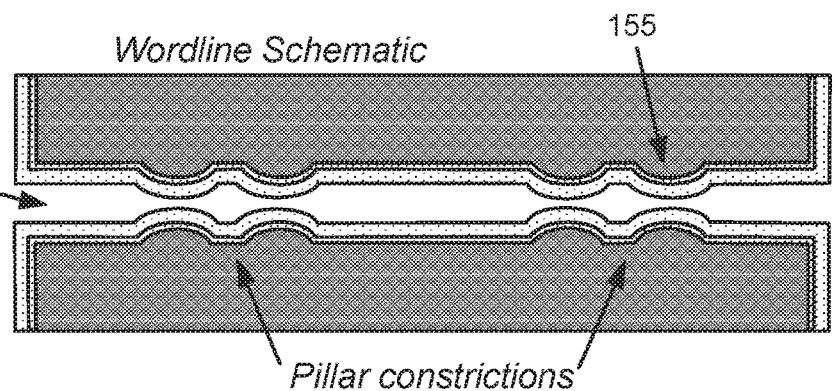

FIG. 1H exhibits a vertical cut through a 3-D NAND structure similar to that shown in FIG. 1F, but here focused on a single pair of wordline features 120 and additionally schematically illustrating a metal fill process which resulted in the formation of a void 175 in the filled wordline features 120. FIG. 1I also schematically illustrates void 175, but in this figure illustrated via a horizontal cut through pillars 155, similar to the horizontal cut exhibited in FIG. 1G. FIG. 1J illustrates the accumulation of tungsten or molybdenum material around the constriction-forming pillars 155, the accumulation resulting in the pinch-off of openings 122, so that no additional tungsten or molybdenum material can be deposited in the region of voids 175. Apparent from FIGS. 1H and 1I is that void-free tungsten or molybdenum fill relies on migration of sufficient quantities of deposition precursor down through vertical structure 130, through openings 122, past the constricting pillars 155, and into the furthest reaches of wordline features 120, prior to the accumulated deposition of tungsten around pillars 155 causing a pinch-off of the openings 122 and preventing further precursor migration into wordline features 120. Similarly, FIG. 1J exhibits a single wordline feature 120 viewed cross-sectionally from above and illustrates how a generally conformal deposition of tungsten or molybdenum material begins to pinch-off the interior of wordline feature 120 due to the fact that the significant width of pillars 155 acts to partially block, and/or narrow, and/or constrict what would otherwise be an open path through wordline feature 120. (It should be noted that the example in FIG. 1J can be understood as a 2-D rendering of the 3-D features of the structure of the pillar constrictions shown in FIG. 1I, thus illustrating constrictions that would be seen in a plan view rather than in a cross-sectional view.)

Three-dimensional structures may need longer and/or more concentrated exposure to precursors to allow the innermost and bottommost areas to be filled. Three-dimensional structures can be particularly challenging when employing WCl precursors because of their proclivity to etch, with longer and more concentrated exposure allowing for more etch as parts of the structure. These challenges may also be present with molybdenum chloride precursors.

Examples of feature fill for horizontally-oriented and vertically-oriented features are described below. It should be noted that in most cases, the examples are applicable to both horizontally-oriented or vertically-oriented features. Moreover, it should also be noted that in the description below, the term "lateral" may be used to refer to a direction generally orthogonal to the feature axis and the term "vertical" to refer to a direction generally along the feature axis.

According to various embodiments, the methods described below involve exposing a structure to multiple reducing agent/purge cycles and/or multiple metal-precursor/purge cycles within an ALD cycle. In some implementations, one or more of the following advantages may be achieved. In some embodiments, multiple tungsten-containing precursor doses interspersed with purge gas pulsing (e.g., W/Ar/W/Ar/W/Ar/W/Ar, where W represents a pulse of a tungsten-containing precursor and Ar a pulse of an argon purge gas) enables delivery of the tungsten-containing precursor deep into the 3-D NAND wordline structure or other hard to fill structure. In some implementations, one or more of the following advantages may be achieved. In some embodiments, multiple molybdenum-containing precursor doses interspersed with purge gas pulsing (e.g., Mo/Ar/Mo/Ar/Mo/Ar/Mo/Ar, where Mo represents a pulse of a molybdenum-containing precursor and Ar a pulse of an argon purge gas) enables delivery of the molybdenum-containing precursor deep into the 3-D NAND wordline structure or other hard to fill structure.

The inert gas purge pulse after each metal-containing pulse can ensure that a monolayer of metal-containing precursor is adsorbed throughout the structure. In some embodiments, the multiple pulses, each followed by a purge gas, ensure that multiple monolayers of the metal-containing precursor do not build up at the parts of the structure that are more accessible. This can prevent undesired etching of the structure. In some embodiments, having alternate pulses enables pressurization of a metal precursor reservoir before each pulse. This can aid in flux to the bottom of the feature. In some embodiments, multiple reducing agent doses interspersed with purge gas pulses pulsing (e.g., $H_2$/Ar/$H_2$/Ar/W/Ar/W/Ar, where $H_2$ is the reducing agent, W represents a pulse of a tungsten-containing precursor and Ar a pulse of an argon purge gas or $H_2$/Ar/$H_2$/Ar/Mo/Ar/Mo/Ar where Mo represents a pulse of molybdenum-containing precursor) provides adequate time for the reducing agent to react with adsorbed chlorides, while allowing the reaction product (e.g., HCl) to leave the surface and make room for the reducing agent in the next pulse.

While the description below focuses on tungsten feature fill and molybdenum feature fill, aspects of the disclosure may also be implemented in filling features with other materials. For example, feature fill using one or more techniques described herein may be used to fill features with other materials including other tungsten-containing materials (e.g., tungsten nitride (WN) and tungsten carbide (WC)), titanium-containing materials (e.g., titanium (Ti), titanium nitride (TiN), titanium silicide (TiSi), titanium carbide (TiC) and titanium aluminide (TiAl)), tantalum-containing materials (e.g., tantalum (Ta), and tantalum nitride (TaN)), and nickel-containing materials (e.g., nickel (Ni) and nickel silicide (NiSi). Further, the methods and apparatus disclosed herein are not limited to feature fill, but can be used to deposit tungsten on any appropriate surface including forming blanket films on planar surfaces.

Figure 2A:
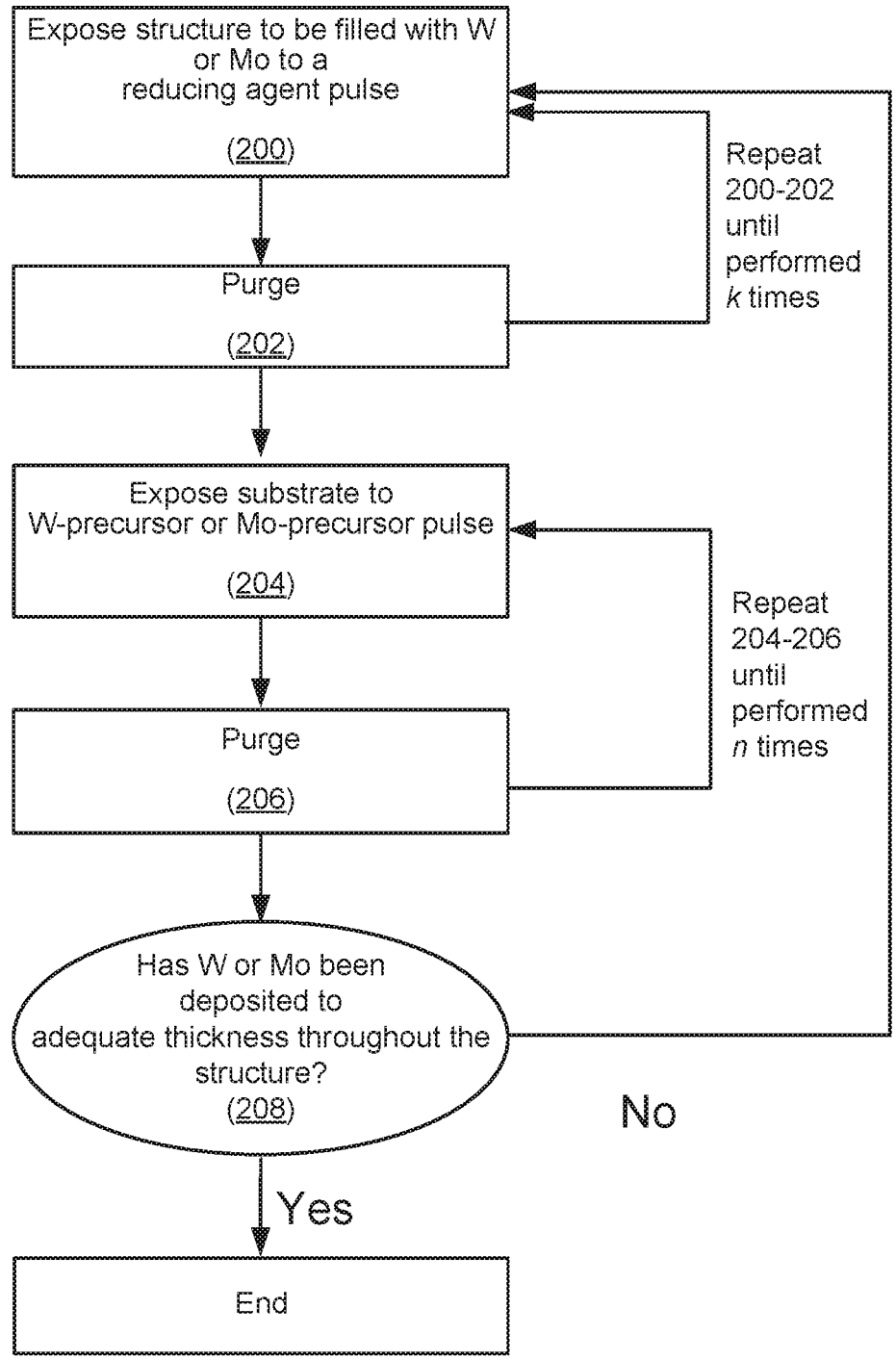
FIGS. 2A-2C is a process flow diagram depicting operations for methods in accordance with certain disclosed embodiments.
Figure 2B:
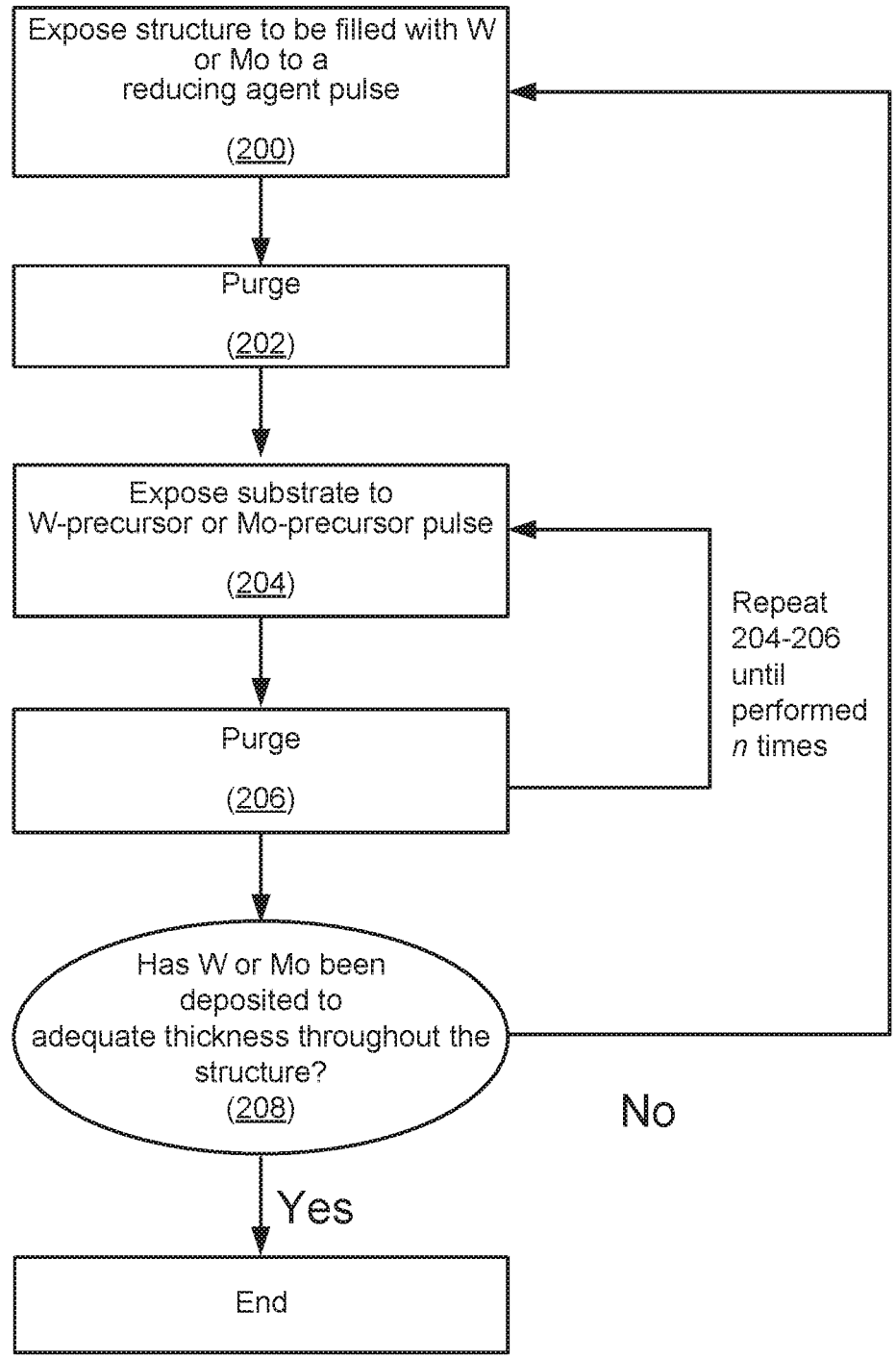
Figure 2C:
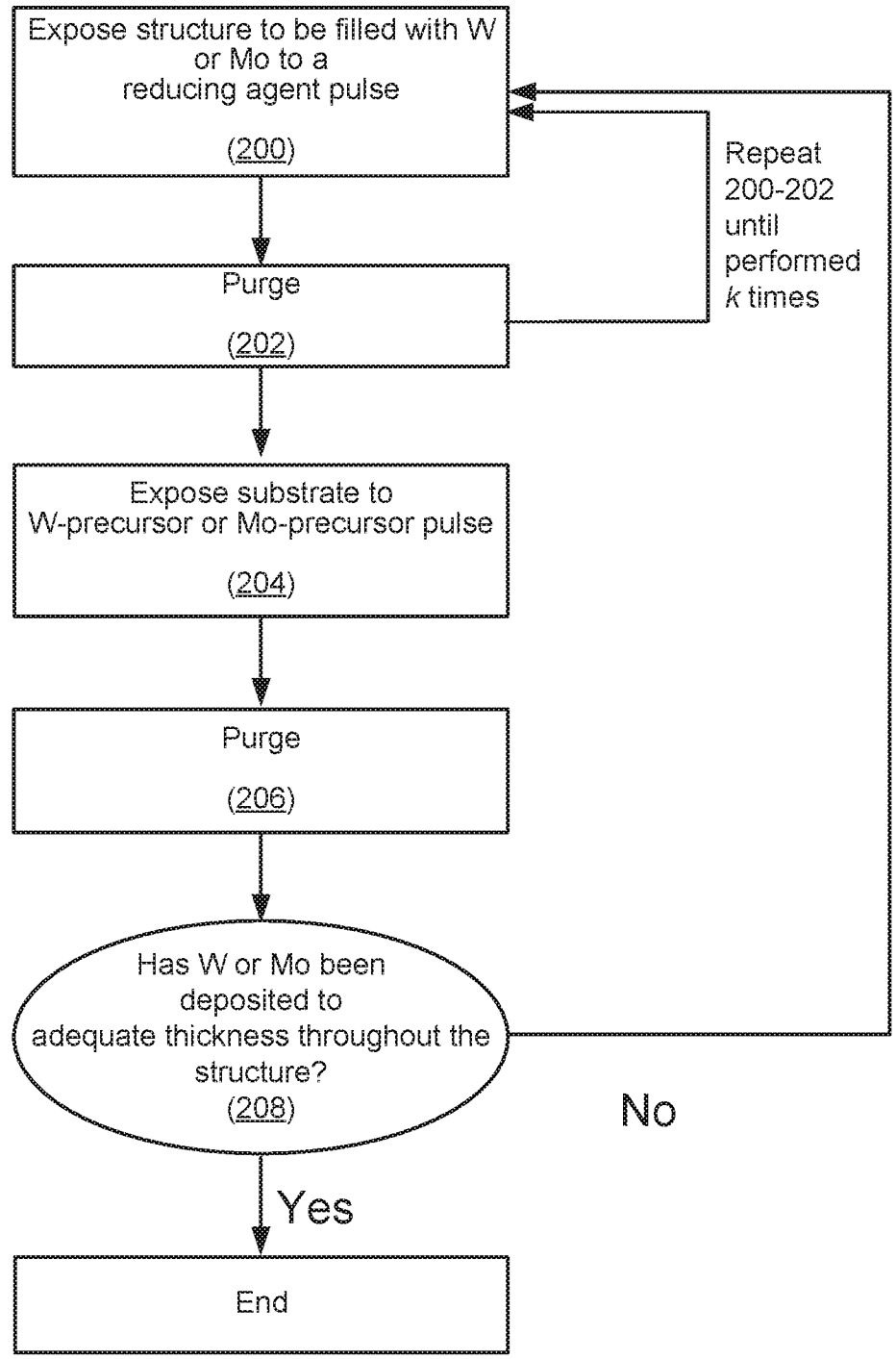

FIGS. 2A-2C provide process flow diagrams for methods performed in accordance with disclosed embodiments. As described below, the method is performed to fill a structure on a substrate with tungsten. Examples of structures are described above with reference to FIGS. 1B-1H.

Temperature may vary depending on the chemistry employed. For $WCl_x$ and $WO_xCl_4$ precursors, certain disclosed embodiments may be performed at a substrate temperature between about 400° C. and about 600° C., such as about 525° C. Substrate temperature refers to the temperature to which the pedestal holding the substrate is set.

For $MoCl_x$ and $MoO_xCl_y$ precursors, certain disclosed embodiments may be performed at a substrate temperature between about 400° C. and about 600° C., such as about 525° C. Substrate temperature refers to the temperature to which the pedestal holding the substrate is set.

Certain disclosed embodiments may be performed at a chamber pressure between about 3 Torr and about 60 Torr. In some embodiments, the chamber pressure for tungsten deposition using $WCl_x$ precursors is between 5 Torr and 20 Torr, e.g., 10 Torr.

Turning to FIG. 2A, in operation 200, a structure to be filled with tungsten or molybdenum is exposed to a reducing agent pulse. In some embodiments, the reducing agent pulse is hydrogen ($H_2$). Other reducing agents, including silanes, boranes, germanes, phosphines, hydrogen-containing gases, and combinations thereof, may be used. In various embodiments, bulk tungsten deposition or bulk molybdenum deposition is performed using hydrogen as a reducing agent. The reducing agent is pulsed without flowing another reactant. In some embodiments, a carrier gas may be flowed. In some embodiments, a carrier gas, such as nitrogen ($N_2$), argon (Ar), helium (He), or other inert gases, may be flowed during operation 200.

Operation 200 may be performed for any suitable duration. Example durations include between about 0.25 seconds and about 30 seconds, about 0.25 seconds and about 20 seconds, about 0.25 seconds and about 5 seconds, or about 0.5 seconds and about 3 seconds.

In operation 202, the chamber is purged to remove excess hydrogen that did not adsorb to the surface of the substrate. A purge may be conducted by flowing an inert gas at a fixed pressure thereby reducing the pressure of the chamber and re-pressurizing the chamber before initiating another reactant gas exposure. Example inert gases include nitrogen ($N_2$), argon (Ar), helium (He), and mixtures thereof. The purge may be performed for a duration between about 0.25 seconds and about 30 seconds, about 0.25 seconds and about 20 seconds, about 0.25 seconds and about 5 seconds, or about 0.5 seconds and about 3 seconds.

Operations 200 and 202 are then repeated until they are performed k times, where k is an integer of at least 21. In one example, operation 200 may have a duration of 0.5 seconds, and operation 202 a duration of 1 seconds between reducing agent pulses. For k=10, the total tungsten precursor time is 0.5×10=5 seconds, with a total purge time of 1×10=10 seconds.

In operation 204, the substrate is exposed to a tungsten precursor or to molybdenum precursor. Example precursors include chlorine-containing tungsten precursors such as tungsten chlorides and tungsten oxychlorides. Tungsten chlorides may be WCh, where x is an integer between and including 2 and 6, such as 2, 3, 4, 5, or 6. Examples include $WCl_5$ and $WCl_6$. The chlorine-containing tungsten precursor may include a mixture of WCl compounds. Tungsten oxychlorides include $WO_xCl_y$, where x and y are numbers greater than 0. Molybdenum precursors including molybdenum chlorides and molybdenum oxychlorides are used to deposit molybdenum. These include molybdenum pentachloride ($MoCl_5$), molybdenum dichloride dioxide ($MoO_2Cl_2$), molybdenum tetrachloride oxide ($MoOCl_4$).

In some embodiments, a carrier gas, such as nitrogen ($N_2$), argon (Ar), helium (He), or other inert gases, may be flowed during operation 206.

Operation 204 may be performed for any suitable duration and at any suitable temperature. In some examples, operation 206 may be performed for a duration between about 0.25 seconds and about 30 seconds, about 0.25 seconds and about 20 seconds, about 0.25 seconds and about 5 seconds, or about 0.5 seconds and about 3 seconds. This operation may be performed in some embodiments for a duration sufficient to saturate the active sites on the surface of the substrate. In some embodiments, the precursor may be diverted to fill the gas line and line change before dosing. The carrier gas may be any of those described above with respect to operation 202.

According to various embodiments, during operation 204, some $WCl_x$ may react with $H_2$ that remains on the surface from operation 200 and some $WCl_x$ may not fully react with $H_2$ that remained on the surface. Also in various embodiments, some $H_2$ may not react with $WCl_x$ at all and $WCl_x$ may instead be physisorbed onto the surface of the substrate where no $H_2$ is physisorbed or remains on the substrate surface. In some embodiments, $H_2$ may remain on the substrate surface but may not be physisorbed or chemisorbed to the surface. Operation 204 of FIG. 2A may thereby form a sub-monolayer of tungsten in some embodiments. Similarly, operation 204 may form a sub-monolayer of molybdenum in some embodiments.

In operation 206, a purge is performed to purge excess precursor still in gas phase that did not react with hydrogen or other reducing agent on the surface of the feature. A purge may be conducted by flowing an inert gas at a fixed pressure thereby reducing the pressure of the chamber and re-pressurizing the chamber before initiating another gas exposure.

The chamber may be purged for any suitable duration. The chamber may be purged for a duration between about 0.25 seconds and about 30 seconds, about 0.25 seconds and about 20 seconds, about 0.25 seconds and about 5 seconds, or about 0.5 seconds and about 3 seconds. In some embodiments, the purge duration is between about 0.1 seconds and about 2 seconds and may prevent removing all of the $WCl_x$ or other precursor from the substrate surface due to the low adsorption rate of $WCl_x$ to a surface of tungsten. In some embodiments, purge duration is between about 0.1 seconds and about 15 seconds, such as about 7 seconds. For example, for fabrication of a 3D NAND structure, the chamber may be purged for about 2 seconds during operation 206. The purge gas may be any of the gases described above with respect to operation 202.

Operations 204 and 206 are then repeated until they are performed n times, where n is an integer of at least 2. As described further below, by performing multiple tungsten pulses separated by purges in the deposition sequence, undesired etching may be reduced at the tops and edges of structures. In one example, operation 204 may have a duration of 0.7 seconds, and operation 206, a duration of 2 seconds between tungsten precursor pulses. For n=10, the total tungsten precursor time is 0.7×10=7 seconds, with a total purge time of 2×10=20 seconds.

In operation 208, it is determined whether the tungsten or molybdenum layer has been deposited to an adequate thickness. If not, operations 200-206 are repeated until a desired thickness of a tungsten or molybdenum layer is deposited on the surface of the feature. Each repetition of operations 200-206 may be referred to as a "cycle." In some embodiments, the order of operations 200/202 and 204/206 may be reversed, such that a tungsten or molybdenum precursor is introduced prior to the introduction of a reducing agent.

FIG. 2B provides a process flow diagram for embodiments in which each ALD cycle includes a single reducing agent pulse and multiple tungsten or molybdenum precursor pulses, such that operations 200 and 202 are not repeated during the cycle. FIG. 2C provides a process flow diagram for embodiments in which each ALD cycle includes a single tungsten or molybdenum precursor pulse and multiple reducing agent pulses such that operations 204 and 206 are not repeated during the cycle. The process blocks in FIGS. 2B and 2C are otherwise as described above with respect to FIG. 2A.

Figure 3:
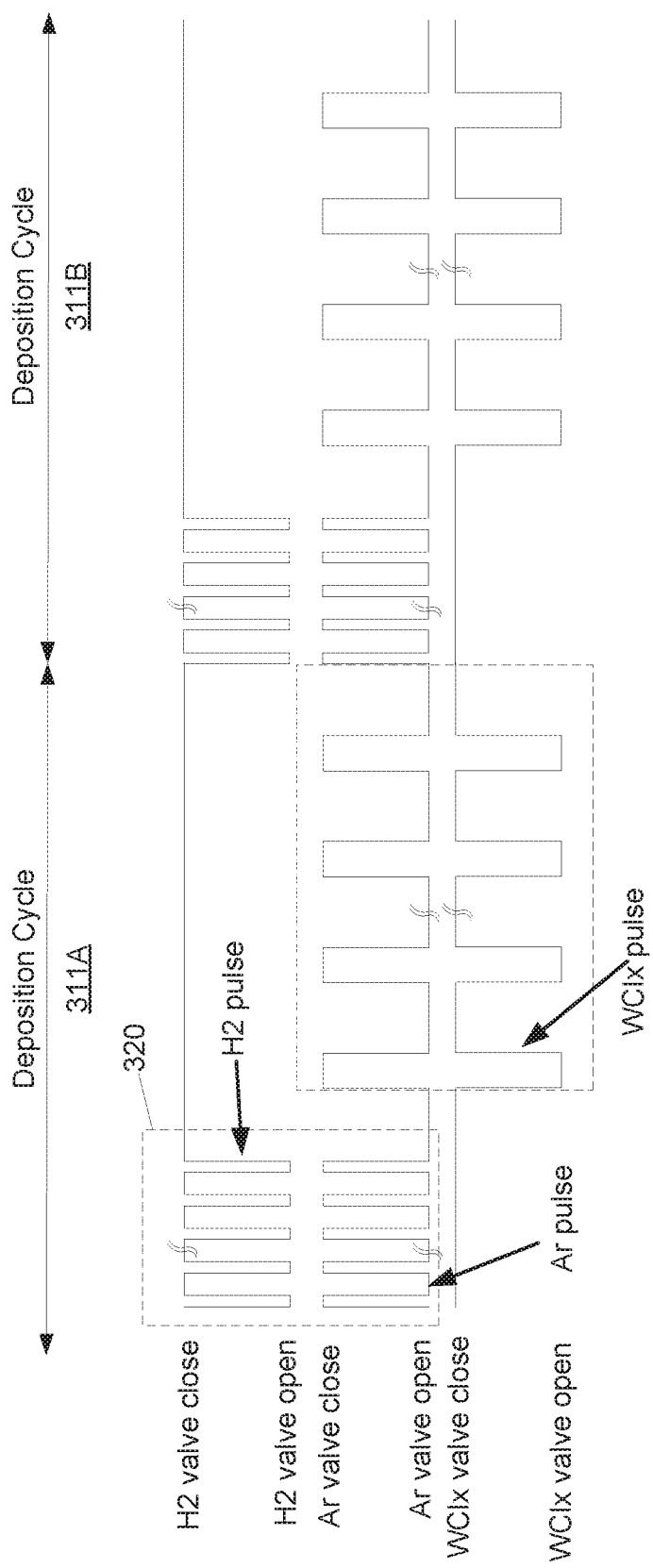
FIG. 3 is a timing sequence diagram showing example cycles in methods for depositing films in accordance with certain disclosed embodiments.

FIG. 3 provides a timing sequence diagram depicting example deposition cycles 311A and 311B in a process for depositing tungsten using $H_2$ and $WCl_x$. FIG. 3 shows $H_2$ pulse in deposition cycle 311A which is an example of an embodiment of operation 200 of FIGS. 2A-2C. In the example of FIG. 3, during a $H_2$ pulse, the Ar and $WCl_x$ flows are turned off. In other embodiments, a purge gas may continue to flow during the reducing agent pulse. In some embodiments, turning the purge gas off during the reducing agent pulse is beneficial to increase exposure to the reducing agent. Immediately after the $H_2$, an Ar pulse is shown. This is an example of an embodiment of operation 202 of FIGS. 2A-2C. During a purge pulse, the $H_2$ and $WCl_x$ flows are turned off. At 320, the dotted box indicates an arbitrary number of $H_2$/Ar purge pulses that are then performed without an intervening tungsten precursor pulse. This is an example of an embodiment of operations 200 and 202 of FIGS. 2A and 2C. Five $H_2$/Ar pulse sequences are shown, but the number of $H_2$/Ar pulse sequences can range from one to k as described above. The dotted box at 340 indicates the repeated $WCl_x$/Ar purge pulses that are then performed without an intervening reducing agent pulse. This is an example of an embodiment of operations 204 and 206 of FIGS. 2A and 2B. During a $WCl_x$ pulse, the Ar valve is closed and during an Ar pulse, the $WCl_x$ valve is closed. Hydrogen flow is off throughout the process. Four $WCl_x$/Ar pulse sequences are shown, but the number of $H_2$/Ar pulse sequences can range from one to n as described above.

It should be noted that in some embodiments, Ar flow may remain on during $H_2$ and/or $WCl_x$ pulses, with Ar pulses characterized by no $H_2$ and $WCl_x$ flows and in some embodiments, increased Ar flow. However, it can be advantageous to turn the purge gas off during a tungsten precursor pulse to prevent further dilution of the tungsten precursor gas (which may be delivered diluted). Fill of 3-D NAND structures benefit from higher W concentration at the wafer; diluting it will result in poor fill. Moreover, turning the purge gas off and pressuring the purge manifold during the tungsten precursor pulse enables a more efficient purging of the chamber than a continuous purge flow with W pulses in between. Similarly, it may be advantageous to turn the purge gas off during a reducing agent pulse to prevent dilution of the reducing agent gas. As shown in FIG. 3, an Ar pulse concludes deposition cycle 311A.

While $WCl_x$ is shown in the example of FIG. 3 for illustrative purposes, the timing sequence in FIG. 3 may be used for other precursors including tungsten oxychloride precursors and molybdenum chloride and molybdenum oxychloride precursors. Similarly, other purge gases and/or other reducing agents may be used instead of Ar and $H_2$.

The processes described in FIGS. 2A-2C and the pulse sequence described with reference to FIG. 3 is an example of a pulse sequence. One having ordinary skill in the art will understand that there are various modifications that may be made. For example, in some embodiments, a different purge gas may be used as described above. Similarly, although the described process is particularly useful for chlorine-containing tungsten or molybdenum precursors and due their proclivity to etch substrates at high concentration, the process may also be used for filling structures with using other precursors and materials, including fluorine-containing W and Mo precursors. In particular, the process may be advantageous for fill of high aspect ratio and/or three-dimensional structures.

Figure 4A:
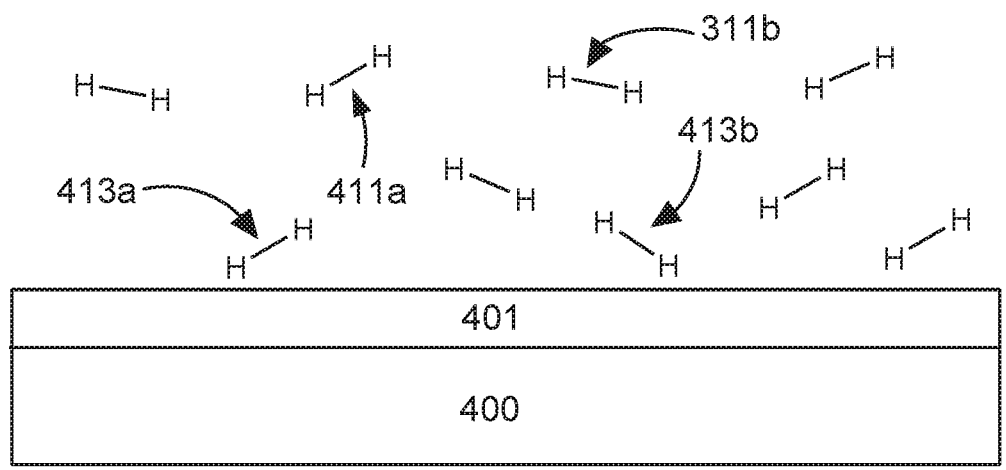
FIGS. 4A-4J are schematic diagrams of an example of a mechanism for depositing films in accordance with certain disclosed embodiments.

FIGS. 4A-4J are schematic illustrations of an example mechanism of a deposition cycle in the deposition of tungsten from $WCl_6$. FIG. 4A depicts an example mechanism where $H_2$ is introduced to the substrate 400, which has an underlayer 401 deposited thereon. Underlayer 401 may be a barrier layer in some embodiments. For example, in some embodiments, underlayer 401 is a titanium nitride (TiN) layer. Note that in some embodiments, the substrate 400 does not include a tungsten nucleation layer. In other embodiments, it may include a tungsten nucleation layer. Hydrogen is introduced in gas phase (411a and 411b) and some $H_2$ (413a and 413b) is on the surface of the underlayer 401, where it may catalytically dissociate into chemically active adsorbed atomic hydrogen on metal surfaces (e.g. $H_2$) or physisorb on catalytically inactive surfaces (e.g. TiN). For example, $H_2$ may not necessarily chemisorb onto the underlayer 401, but in some embodiments, may physisorb onto the surface of the underlayer 401.

Figure 4B:
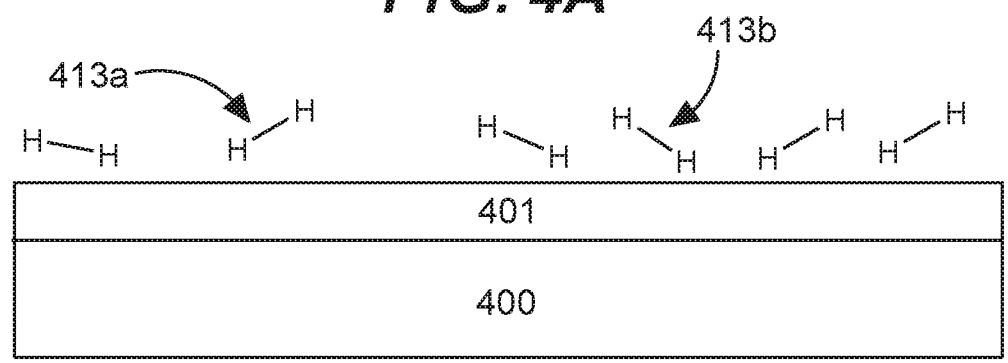

FIG. 4B shows an example illustration whereby $H_2$ previously in gas phase (411a and 411b in FIG. 4A) are purged from the chamber, and $H_2$ previously on the surface (443a and 413b) remain on the surface of the underlayer 401.

Figure 4C:
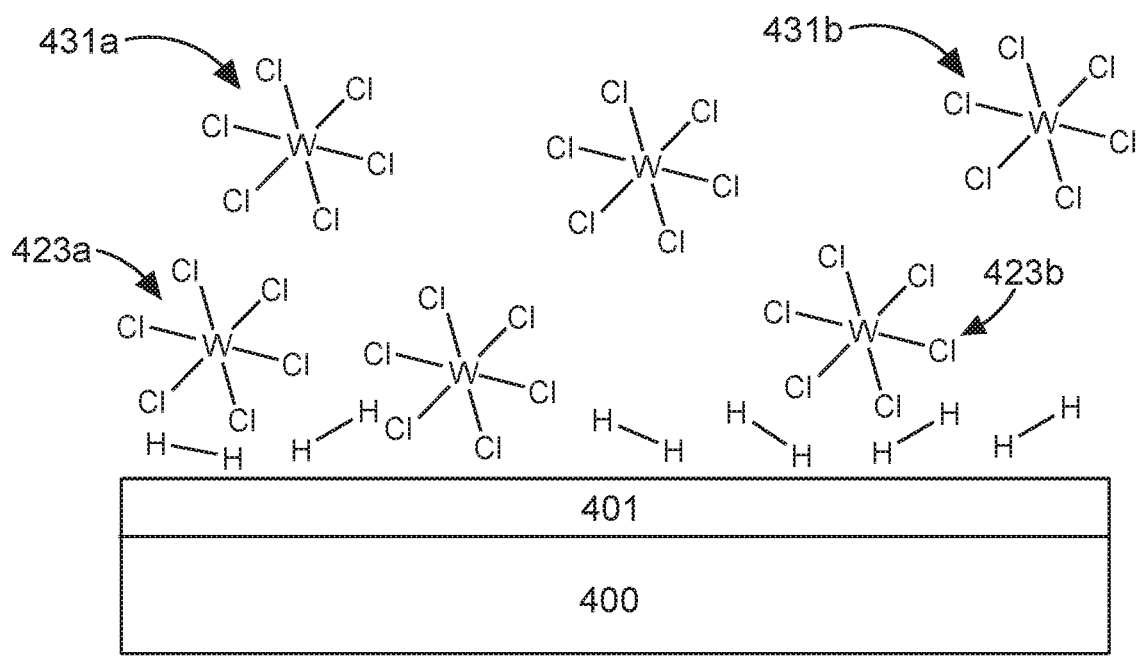

FIG. 4C shows an example schematic illustration whereby the substrate is exposed to $WCl_6$, some of which is in gas phase (431a and 431b) and some of which is at or near the surface of the substrate (423a and 423b).

Figure 4D:
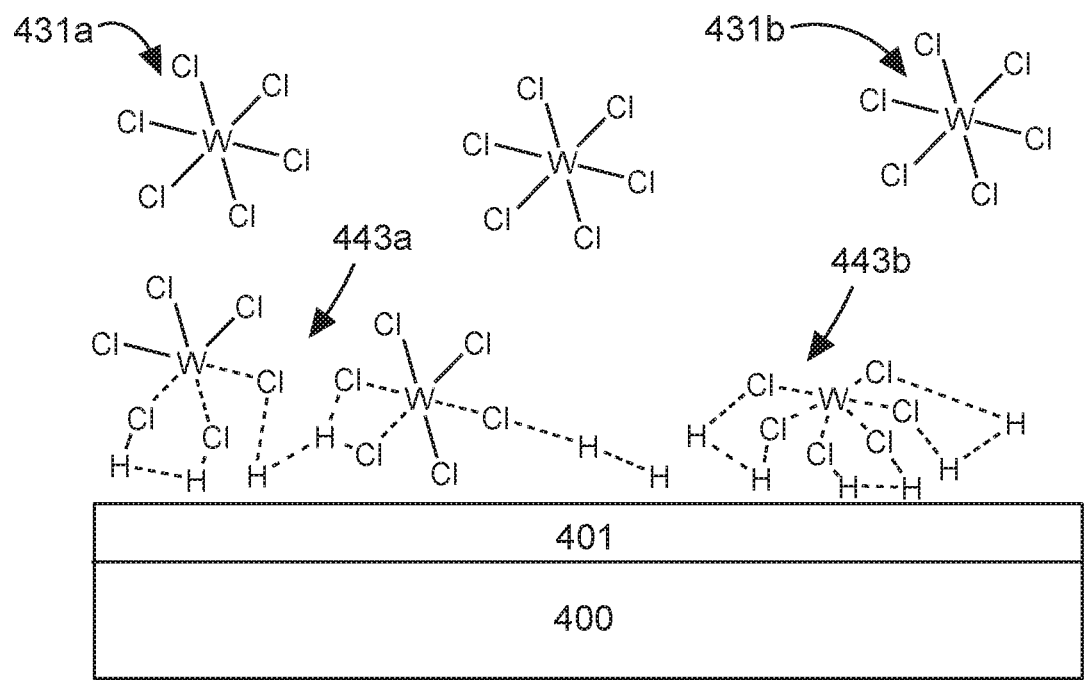
Figure 4E:
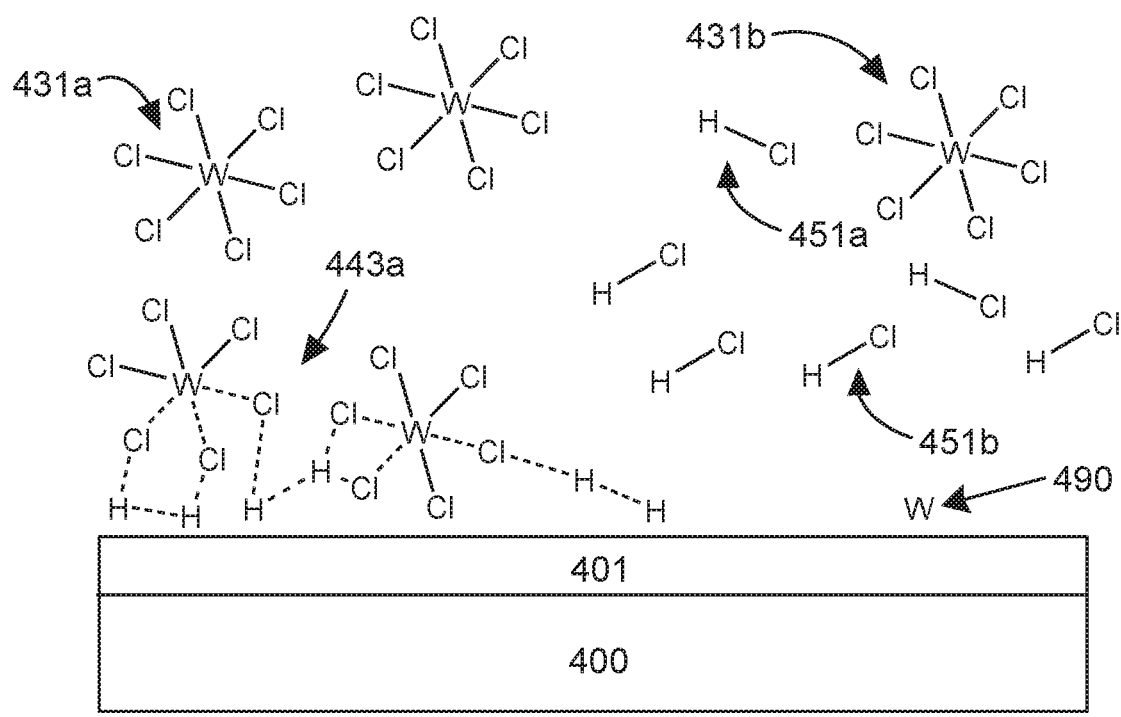

During operation 200, some $H_2$ may react with $WCl_6$ that remained on the surface from the prior dose. In FIG. 4D, $WCl_6$ may react with $H_2$ to temporarily form intermediate 443b, whereby in FIG. 4E, intermediate 443b fully reacts to leave tungsten 490 on the surface of the substrate 400 on the underlayer 401, and HCl in gas phase (451a and 451b, for example). Note that in this example, tungsten 490 grows directly on the underlayer 401 without depositing a nucleation layer and without treating the underlayer 401 prior to depositing tungsten. It will be understood that in some embodiments, prior to exposing the underlayer 401 to hydrogen or a chlorine-containing tungsten precursor, the underlayer 401 may be exposed to a soak treatment, such as by exposing to diborane. In some instances the underlayer 401 may have been previously treated with a mixture of $SiH_4$, $B_2H_6$, and $H_2$ to form a solid Si—B—H interfacial surface layer that can react sacrificially during subsequent $WCl_x$-$H_2$ exposures. The stoichiometry of the Si—B—H layers can vary greatly from low (10%) to high (95%) boron concentration.

During operation 200 in FIGS. 2A-2C, some $H_2$ may not fully react with $WCl_6$ (or other W chlorides) that remained on the surface from the prior dose. As shown in FIG. 4D, $WCl_6$ may partially react with $H_2$ to form intermediate 443a, whereby in FIG. 4E, intermediate 443a remains partially reacted on the surface of the substrate 400 on the underlayer 401. In various embodiments, the film deposited using a chlorine-containing tungsten precursor and hydrogen has a lower resistivity than a film deposited using a borane, silane, or germane, for deposition thicknesses up to about 50 Å. For example, without being bound by a particular theory, the stoichiometry of $WCl_6$ may use at least three $H_2$ molecules to react with one molecule of $WCl_6$. It is possible that $WCl_6$ partially reacts with molecules of $H_2$ but rather than forming tungsten, an intermediate is formed. For example, this may occur if there is not enough $H_2$ in its vicinity to react with $WCl_6$ based on stoichiometric principles (e.g., three $H_2$ molecules are used to react with one molecule of $WCl_6$) thereby leaving an intermediate 343a on the surface of the substrate. Tungsten chlorides may be chemically inert to molecular $H_2$ and require the presence of adsorbed atomic hydrogen created by the catalytic dissociation of molecular $H_2$. In this case large excesses of molecular $H_2$ beyond simple stoichiometric ratios may be required to fully reduce tungsten chlorides to metallic tungsten (molecular $H_2$/WClx ratios of 100's to 1).

Figure 4F:
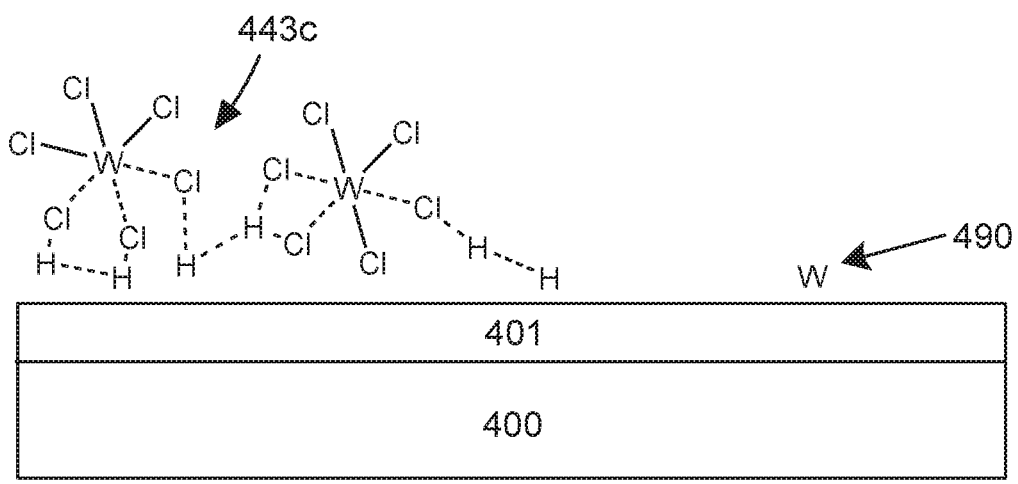

FIG. 4F provides an example schematic of the substrate when the chamber is purged. This may correspond to operation 202 of FIGS. 2A-2C. Note that compound 443c of FIG. 4F may be an intermediate formed but not completely reacted, while some tungsten 490 may be formed on the substrate. Each cycle thereby forms a sub-monolayer of tungsten on the substrate.

Figure 4G:
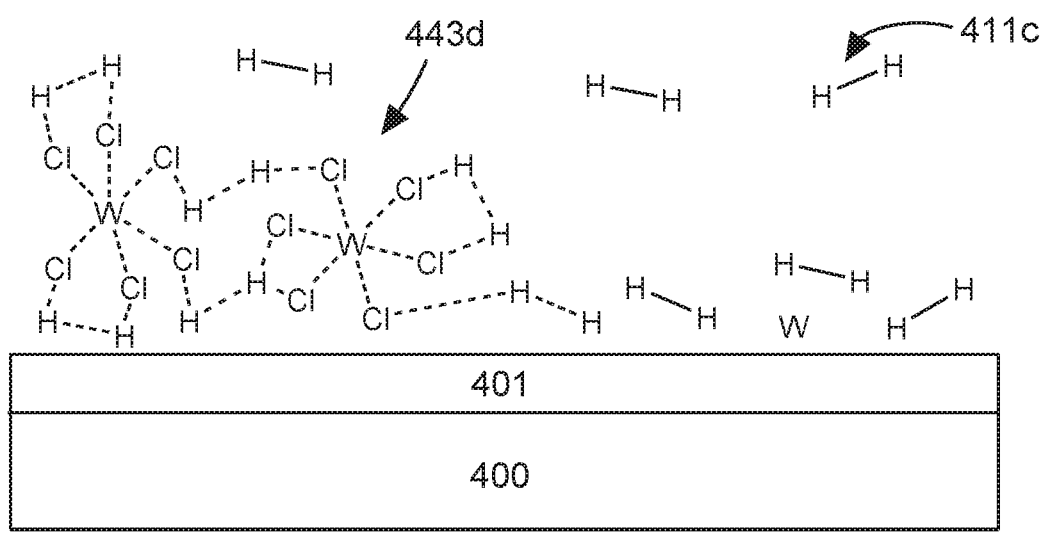
Figure 4H:
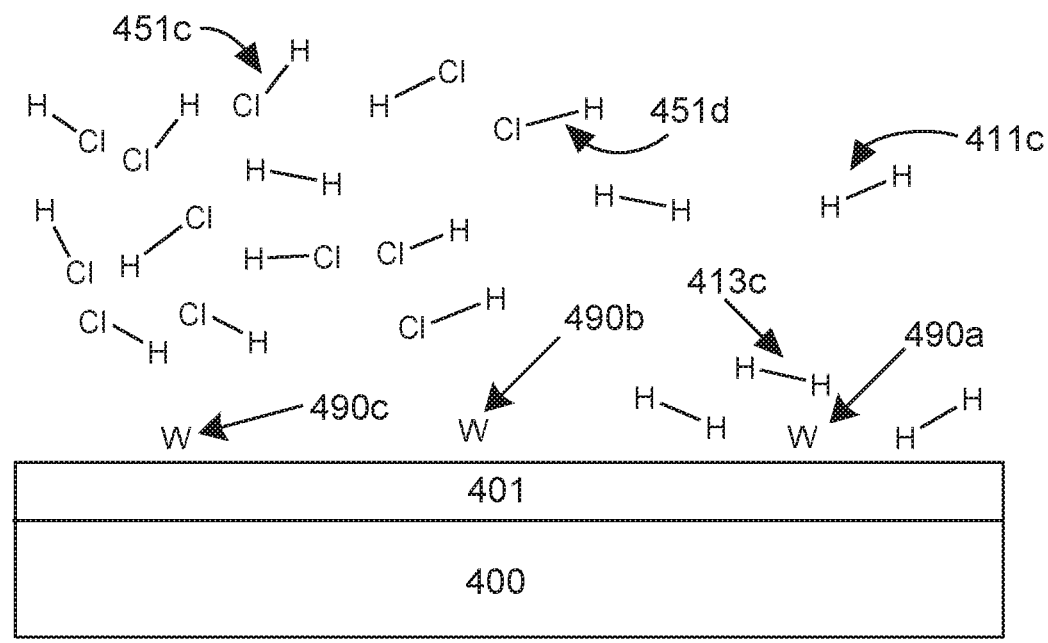

As an example, FIG. 4G shows an illustration when a cycle is repeated, whereby $H_2$ 411c in gas phase is introduced to the substrate with the deposited tungsten 490 and the partially reacted intermediate 443d thereon. This may correspond to operation 200 of FIGS. 2A-2C in a repeated cycle after determining in operation 208 that tungsten has not been deposited to an adequate thickness. Note that as shown in FIG. 4G, the $H_2$ introduced may now fully react with the intermediate 443d on the substrate such that, as shown in FIG. 4H, the reacted compound 443d leaves behind deposited tungsten 490b and 490c, and byproducts HCl 451c and 451d are formed in gas phase. Some $H_2$411c may remain in gas phase, while some $H_2$ 413c may remain on the tungsten layer 490a.

Figure 4I:
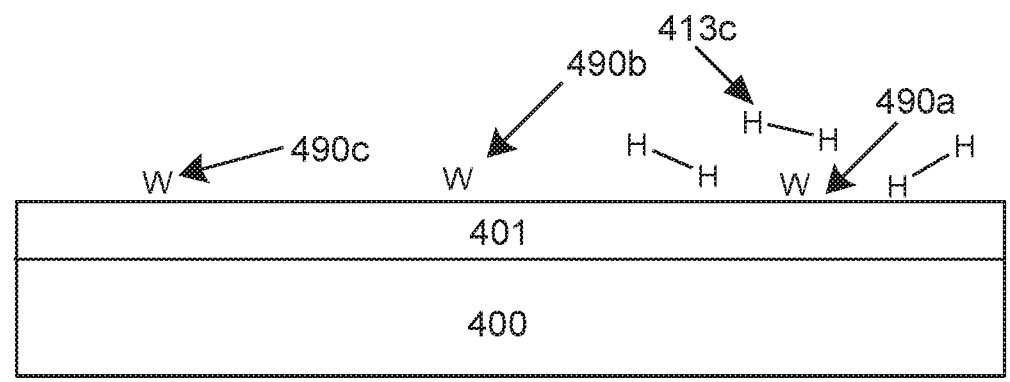
Figure 4J:
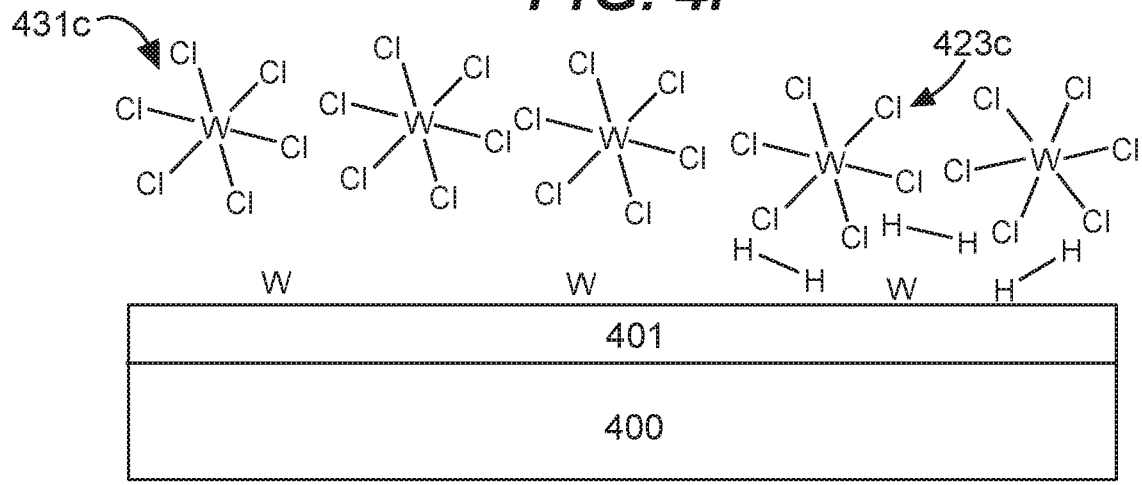

In FIG. 4I, the chamber is purged (thereby corresponding with operation 202 of FIGS. 2A-2C), leaving behind deposited tungsten 490a, 490b, and 490c, and some $H_2$ 413c. In FIG. 4J, $WCl_6$ is again introduced in a dose such that molecules 431c and 423c may then adsorb and/or react with $H_2$ and the substrate. FIG. 4J may correspond to operation 204 of FIGS. 2A-2C. After the $WCl_6$ dose, the chamber may again be purged and cycles may be repeated again until the desired thickness of tungsten is deposited.

Tungsten films deposited using certain disclosed embodiments have no fluorine content. Molybdenum films may also have no fluorine content. Overall tensile stress of films may be less than about 0.2 GPa. Fluorine-free tungsten precursors may include tungsten carbonyl ($W(CO)_6$) and tungsten chlorides (WCl) such as tungsten pentachloride (WCl$_5$) and tungsten hexachloride (WCl$_6$). Fluorine-free molybdenum precursors include the molybdenum oxychloride and molybdenum chloride precursors described herein as well as molybdenum hexacarbonyl (Mo(CO)$_6$).

Disclosed embodiments may have various applications in tungsten and molybdenum deposition processes. It will be understood that various combinations of the applications described herein may be used to deposit tungsten or molybdenum and methods are not limited to the examples provided herein.

For example, in some embodiments, a feature may be filled by depositing a tungsten nucleation layer by ALD cycles of alternating pulses of a reducing agent (e.g., a borane, a silane, or a germane with hydrogen) and a tungsten precursor such as WCl$_6$, followed by bulk tungsten deposition by alternating pulses of hydrogen and a chlorine-containing tungsten precursor as described above with respect to FIGS. 2 and 3. Similarly, in some embodiments, a feature may be filled by depositing a molybdenum layer by ALD cycles of alternating pulses of a reducing agent and a molybdenum precursor. Deposition of bulk tungsten by a process that uses alternating pulses of a tungsten chloride precursor and a hydrogen reducing agent may be referred to as ALD processes due to the alternating pulses of reactants. The methods described herein typically involve purging between reactant cycles to ensure that there is no growth component from a CVD mechanism.

However, in some embodiments, the methods may be used with "sequential CVD" processes as described in U.S. Patent Publication No. 20170117155 and U.S. Pat. No. 9,613,818, both of which are incorporated herein by reference.

By employing multiple cycles of alternating precursor and purge gas pulses during a single deposition cycle, the precursor can be delivered deep into 3D NAND wordlines with minimizing etching at the top and lateral edges of the structures. A monolayer or sub-monolayer of the precursor can be adsorbed throughout the structure. In some embodiments, having alternate precursor and purge pulses enables a precursor reservoir to be pressurized before precursor dose delivery. This can result in better transport into the structure.

Table 1 shows conditions and resulting TiN underlayer etch for 300 Angstrom PVD TiN blanket films exposed to a H$_2$/Ar/WCl$_x$/Ar sequence and a H$_2$/Ar/n(WCl$_x$/Ar) sequence, with n equal to 10.

| Process | Underlayer | W Dose Time | Ar Purge Time | Cycles | Partial pressure * duration (W Torr-Sec) * 1000 | TiN Etch (Angstroms) |
| --- | --- | --- | --- | --- | --- | --- |
| FFW 10 W/Ar Pulses 0.5% W | 300 A PVD TiN | x | y | 10z | 250 | 144 |
| FFW 1 W/Ar Pulses 0.5% W | 300 A PVD TiN | 10x | 10y | z | 250 | 300 |

The conditions and results in Table 1 show that for the same overall tungsten precursor exposure, the amount of TiN etched is significantly lower with multiple pulses of tungsten precursor. Notably, all of the TiN was etched for the sequence having a single tungsten precursor pulse.

Figure 5:
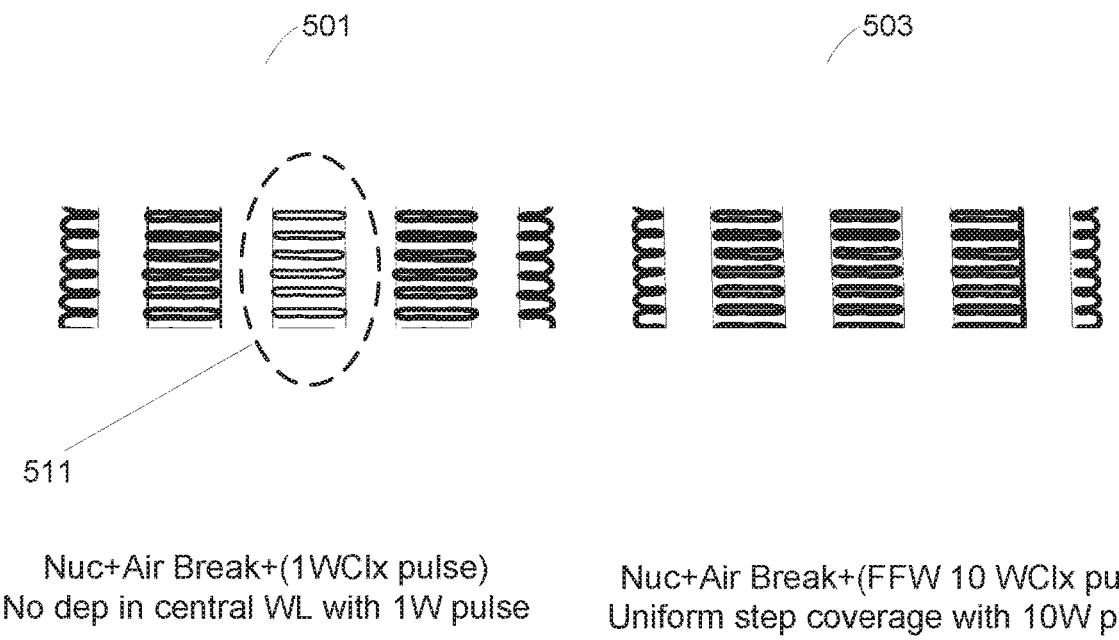
FIG. 5 shows an illustration of experimental results comparing tungsten fill of 3-D NAND structures using a H2/Ar/WClx/Ar sequence and a H2/Ar/n(WClx/Ar) sequence.

FIG. 5 shows a schematic illustration of experimental results comparing tungsten fill of 3-D NAND structures using a H$_2$/Ar/WCl$_x$/Ar sequence and a H$_2$/Ar/n(WCl$_x$/Ar) sequence. A nucleation layer was deposited in each structure prior to these sequences. The illustrations in FIG. 5 are representative of cross-sections from the middle sections of 3-D NAND structures. 3-D NAND structure 503 was imaged after a H$_2$/Ar/WCl$_x$/Ar sequence, shows poor tungsten deposition in center wordlines, as indicated at 511. Uniform tungsten deposition is observed throughout the 3-D NAND structure 503, which was exposed to a H$_2$/Ar/n (WCl$_x$/Ar), with n=10. The total tungsten precursor exposure in Torr-s was the same for both 501 and 503.

Each of the n tungsten pulses is short and may be delivered at a constant pressure. The total amount of tungsten precursor is sufficient for the tungsten precursor to reach the bottom of the structure and to provide enough material to coat the entire structure laterally. The intervening inert gas purge may remove the tungsten precursor at the top and edges of structure, reducing or eliminating substrate etch. If there is not a sufficient inert gas purge, this beneficial effect may not be observed. Further, a pinching effect at peripheral openings may be observed for insufficient purge between multiple tungsten pulses.

Accordingly, in some embodiments, the duration of the inert gas purge is at least as long as the tungsten or molybdenum precursor duration. In some embodiments, the inert gas purge is at least 1.5 times, or at least 2 times, or at least 3 times the duration of the tungsten or molybdenum precursor pulse. The purge gas to precursor exposure may also be characterized in terms of partial pressure×duration. The purge may be performed with 100% purge gas, with a precursor diluted to 1% to 5% of flow.

While the above description focuses on deposition of tungsten and tungsten-containing layers from tungsten chlorides, the processes described above with reference to FIGS. 2 and 3 may be performed with feature fill using other precursors and/or other materials. As indicated above, the method is beneficial for chemistries that can etch the structure. In addition, the methods including multiple precursor pulse/purge cycles may be beneficial to obtain growth without a CVD-type character by purging non-adsorbed molecules.

Disclosed embodiments may be performed at any suitable pressure, such as pressures greater than about 10 Torr, or pressures less than about 10 Torr. For a multi-station chamber, each pedestal may be set at different temperatures. In some embodiments, each pedestal is set at the same temperature. Substrates may be cycled from station to station during any or all of any of the above described operations in accordance with disclosed embodiments.

Chamber pressure may also be modulated in one or more operations of certain disclosed embodiments. In some embodiments, chamber pressure during nucleation deposition is different from chamber pressure during bulk deposition. In some embodiments, chamber pressure during nucleation deposition is the same as the chamber pressure during bulk deposition.

Apparatus

Any suitable chamber may be used to implement the disclosed embodiments. Example deposition apparatuses include various systems, e.g., ALTUS® and ALTUS® Max, available from Lam Research Corp., of Fremont, Calif., or any of a variety of other commercially available processing systems. In some embodiments, sequential chemical vapor deposition (CVD) may be performed at a first station that is one of two, five, or even more deposition stations positioned within a single deposition chamber. Thus, for example, hydrogen (H$_2$) and tungsten hexachloride (WCl$_6$) may be introduced in alternating pulses to the surface of the semiconductor substrate, at the first station, using an individual gas supply system that creates a localized atmosphere at the substrate surface. Another station may be used for fluorine-free tungsten deposition, or CVD. Two or more stations may be used to deposit tungsten in a parallel processing. Alternatively a wafer may be indexed to have the sequential CVD operations performed over two or more stations sequentially.

Figure 6:
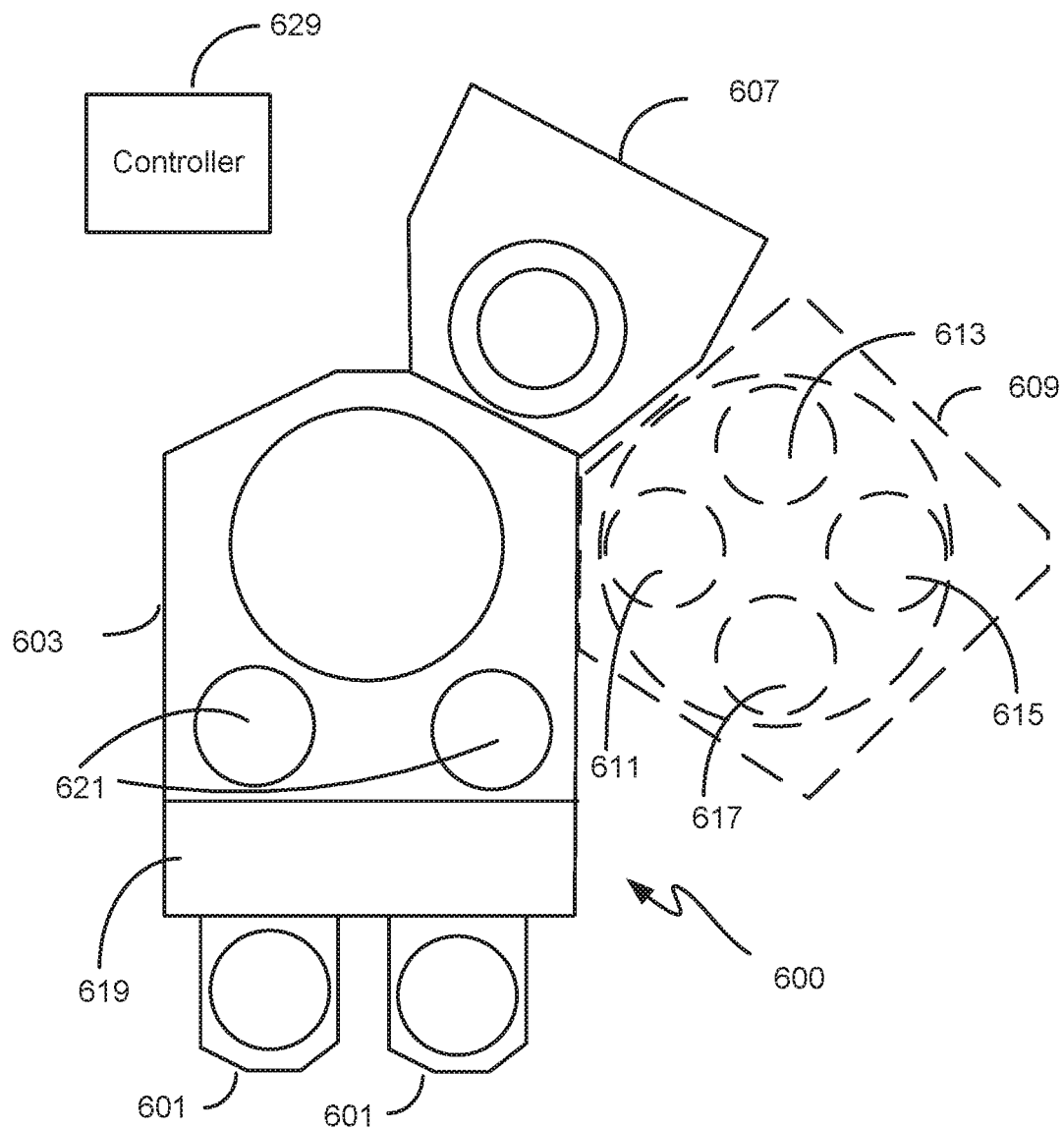
FIG. 6 is a schematic diagram of an example process tool for performing certain disclosed embodiments.

FIG. 6 is a schematic of a process system suitable for conducting deposition processes in accordance with embodiments. The system 600 includes a transfer module 603.

The transfer module 603 provides a clean, pressurized environment to minimize risk of contamination of substrates being processed as they are moved between various reactor modules. Mounted on the transfer module 603 is a multi-station reactor 609 capable of performing ALD and CVD according to various embodiments. Multi-station reactor 609 may include multiple stations 611, 613, 615, and 617 that may sequentially perform operations in accordance with disclosed embodiments. For example, multi-station reactor 609 may be configured such that station 611 performs a PNL tungsten nucleation layer deposition using a chlorine-containing tungsten precursor or a fluorine-containing precursor, and station 613 performs an ALD tungsten deposition operation according to various embodiments. In some embodiments, station 615 may also form an ALD tungsten deposition operation, and station 617 may perform a non-sequential CVD operation. In some embodiments, the number (n) of tungsten precursor pulses may be varied from station 613 to 615.

Figure 7:
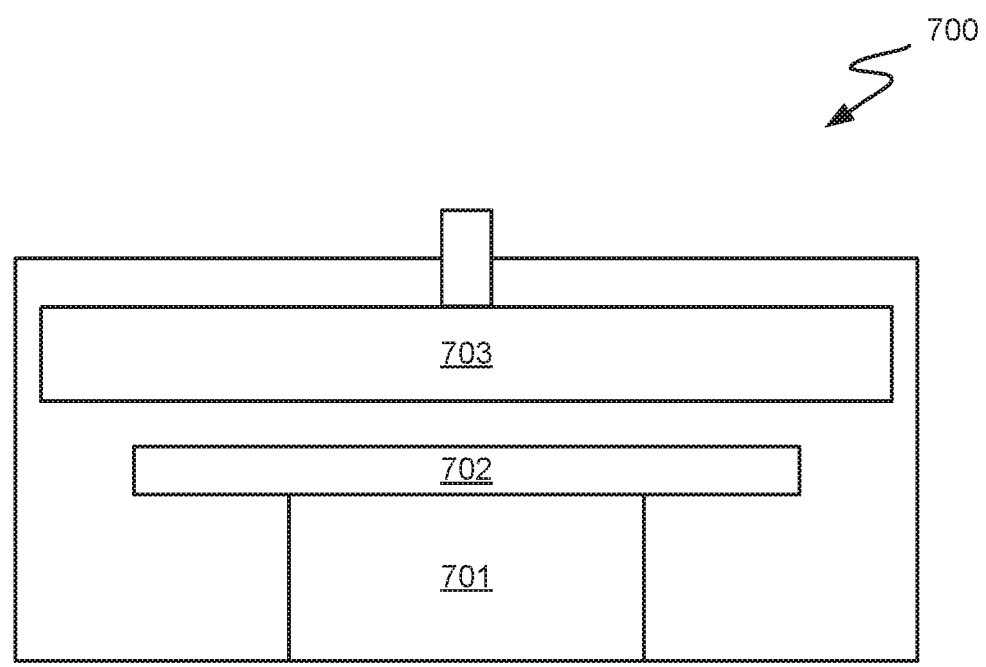
FIG. 7 is a schematic diagram of an example station for performing certain disclosed embodiments.

Stations may include a heated pedestal or substrate support, one or more gas inlets or showerhead or dispersion plate. An example of a deposition station 700 is depicted in FIG. 7, including substrate support 702 and showerhead 703. A heater may be provided in pedestal portion 701.

Returning to FIG. 6, also mounted on the transfer module 503 may be one or more single or multi-station modules 607 capable of performing plasma or chemical (non-plasma) pre-cleans, other deposition operations, or etch operations. The module may also be used for various treatments to, for example, prepare a substrate for a deposition process. The system 600 also includes one or more wafer source modules 601, where wafers are stored before and after processing. An atmospheric robot (not shown) in the atmospheric transfer chamber 619 may first remove wafers from the source modules 601 to loadlocks 621. A wafer transfer device (generally a robot arm unit) in the transfer module 603 moves the wafers from loadlocks 621 to and among the modules mounted on the transfer module 603.

In various embodiments, a system controller 629 is employed to control process conditions during deposition. The controller 629 will typically include one or more memory devices and one or more processors. A processor may include a CPU or computer, analog and/or digital input/output connections, stepper motor controller boards, etc.

The controller 629 may control all of the activities of the deposition apparatus. The system controller 629 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 629 may be employed in some embodiments.

Typically there will be a user interface associated with the controller 629. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 629. The signals for controlling the process are output on the analog and digital output connections of the deposition apparatus 600.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

In some implementations, a controller 629 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 629, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 629, in some implementations, may be a part of or coupled to a computer that is integrated with, coupled to the system, otherwise networked to the system, or a combination thereof. For example, the controller 629 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 629 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

Figure 8:
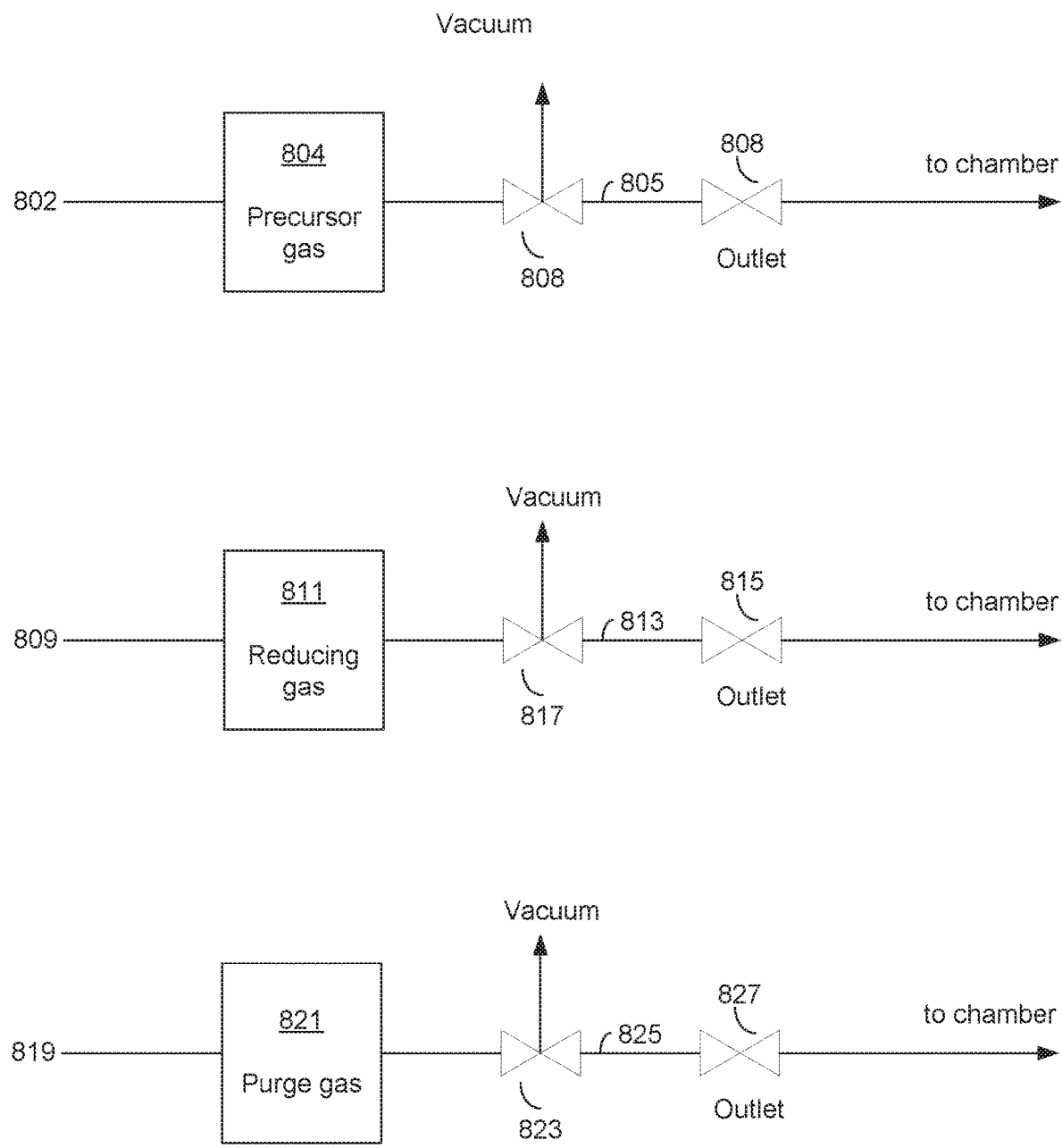
FIG. 8 is a schematic diagram showing basic features of a manifold system that may be used in accordance with certain embodiments.

The apparatus may include a gas manifold system, which provides line charges to the various gas distribution lines as shown schematically in FIG. 8. Manifold 804 has an input 802 from a source of a tungsten-containing or molybdenum-containing precursor gas (not shown), manifold 811 has an input 809 from a source of hydrogen or other reducing gas (not shown) and manifold 821 has an input 819 from a source of inert purge gas (not shown). The manifolds 804, 811 and 821 provide the precursor gas, reducing gas and purge gas to the deposition chamber through valved distribution lines, 805, 813 and 825 respectively. The various valves may be opened or closed to provide a line charge, i.e., to pressurize the distribution lines. For example, to pressurize distribution line 805, valve 806 is closed to vacuum and valve 808 is closed. After a suitable increment of time, valve 808 is opened and the precursor gas is delivered to the chamber. After a suitable time for delivery of the gas, valve 808 is closed. The chamber can then be purged to a vacuum by opening of valve 806 to vacuum.

Similar processes are used to deliver the reducing gas and the purge gas. To introduce the reducing gas, for example, distribution line 813 is charged by closing valve 815 and closing valve 817 to vacuum. Opening of valve 815 allows for delivery of the reducing gas to the chamber. Similarly, to introduce the purge gas, distribution line 825 is charged by closing valve 827 and closing valve 823 to vacuum. Opening of valve 827 allows for delivery of the argon or other inert purge gas to the chamber. The amount of time allowed for line charges changes the amount and timing of the initial delivery of the gas.

FIG. 6 also shows vacuum pumps in which valves 806, 817 and 823, respectively, can be opened to purge the system. The supply of gas through the various distribution lines is controlled by a controller, such as a mass flow controller which is controlled by a microprocessor, a digital signal processor or the like, that is programmed with the flow rates, duration of the flow, and the sequencing of the processes.

Note that the processes described above may require precise timing of valves and mass flow controllers (MFCs) supplying pulses of reagent to the semiconductor substrate during deposition. In one way to make this possible, valve and MFC commands are delivered to embedded digital input-output controllers (IOC) in discrete packets of information containing instructions for all time-critical commands for all or a part of a PNL deposition sequence. The ALTUS systems of Lam Research provide at least one IOC sequence. The IOCs can be physically located at various points in the apparatus; e.g., within the process module or on a stand-alone power rack standing some distance away from the process module. There are typically multiple IOCs in each module (e.g., 3 per module). With respect to the actual instructions included in a sequence, all commands for controlling valves and setting flow for MFCs (for all carrier and reactant gases) may be included in a single IOC sequence. This assures that the timing of all the devices is tightly controlled from an absolute standpoint and also relative to each other. There are typically multiple IOC sequences running at any given time. This allows for, say, PNL to run at station 1-2 with all timing controlled for all the hardware components needed to deposit a PNL-W nucleation layer at those stations. A second sequence might be running concurrently to deposit a tungsten bulk using the timing sequence described above at other deposition stations in the same module. The relative timing of the devices controlling the delivery of reagents to stations 3-4 is important within that group of devices, but the relative timing of the PNL process at stations 1-2 can be offset from the relative timing of stations 3-4. An IOC translates the information in a packetized sequence and delivers digital or analog command signals directly to MFC or pneumatic solenoid banks controlling the valves.

A pulse of tungsten-containing gas may be generated as follows. Initially, the system diverts WCl to a vacuum pump for a period of time while the MFC or other flow-controlling device stabilizes. This may be done for a period of between about 0.5 to 5 seconds in one example. Next, the system pressurizes the tungsten gas delivery manifold by closing both the divert outlet 606 and the outlet 608 to the deposition chamber. This may be done for a period of between about 0.1 and 5 seconds, for example, to create an initial burst of reagent when the outlet to the deposition chamber is opened. This is accomplished by opening outlet valve 808 for between about 0.1 and 10 seconds in one example. Thereafter, the tungsten-containing gas is purged from the deposition chamber using a suitable purge gas. The pulsed flow of other reagents may be done in a similar manner. A pulse of molybdenum-containing gas may be generating in a similar fashion.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically includes some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
providing a structure to be filled with a metal-containing material;
exposing the structure to multiple deposition cycles, wherein each deposition cycle comprises:
exposure to a hydrogen ($H_2$) pulse followed by exposure to an inert gas purge pulse; and
exposure to multiple alternating metal precursor pulses and inert gas purge pulses, wherein the multiple alternating metal precursor pulses and inert gas purge pulses are performed without an intervening $H_2$ pulse.

2. The method of claim 1, wherein the metal precursor is a chlorine-containing metal precursor and a pulse of the chlorine-containing metal precursor comprises between about 0.1% and about 1.5% of chlorine-containing metal precursor by volume.

3. The method of claim 1, wherein the exposure to multiple alternating metal precursor pulses and inert gas purge pulses comprises turning the inert gas purge flow off during the metal precursor pulses.

4. The method of claim 1, wherein a duration of the inert gas purge pulse is at least 1.5 times that of a metal precursor pulse.

5. The method of claim 1, wherein each deposition cycle comprises only a single $H_2$ pulse.

6. The method of claim 1, wherein each deposition cycle comprises multiple alternating $H_2$ pulses and inert gas purge pulses.

7. The method of claim 1, wherein the structure is a partially fabricated three-dimension (3-D) NAND structure comprising sidewalls and a plurality of openings in the sidewalls leading to a plurality of features having a plurality of interior regions fluidically accessible through the openings.

8. The method of claim 1, wherein each deposition cycle comprises at least five alternating metal precursor pulses and inert gas purge pulses without an intervening $H_2$ pulse.

9. A method comprising:
providing a structure to be filled with a metal-containing material;
exposing the structure to multiple deposition cycles, wherein each deposition cycle comprises:

exposure to a multiple alternating hydrogen ($H_2$) pulses and inert gas purge pulses, wherein the multiple alternating $H_2$ pulses and inert gas purge pulses are performed without an intervening metal precursor pulse; and exposure to a metal precursor pulse followed by an inert gas purge pulse.

10. The method of claim 9, wherein the metal is tungsten (W) or molybdenum (Mo).

11. The method of claim 9, wherein the metal precursor is a chlorine-containing metal precursor.

12. The method of claim 11, wherein the chlorine-containing metal precursor comprises a tungsten chloride or a tungsten oxychloride.

13. The method of claim 11, wherein the chlorine-containing metal precursor comprises a molybdenum chloride or a molybdenum oxychloride.

14. The method of claim 11, wherein chlorine-containing metal precursor comprises at least one of $WCl_5$, $WCl_6$, $MoCl_5$, $MoO_2Cl_2$, and $MoOCl_4$.

15. The method of claim 11, wherein a pulse of the chlorine-containing metal precursor comprises between about 0.1% and about 1.5% of chlorine-containing tungsten precursor by volume.

16. The method of claim 9, wherein the exposure to multiple alternating $H_2$ pulses and inert gas purge pulses comprises turning the inert gas purge flow off during the $H_2$ pulses.

17. The method of claim 9, wherein a duration of the inert gas purge pulse is at least 1.5 times that of a $H_2$ pulse.

18. The method of claim 9, wherein each deposition cycle comprises at least five alternating $H_2$ pulses and inert gas purge pulses without an intervening metal precursor pulse.

19. The method of claim 9, wherein each deposition cycle comprises at least ten alternating metal precursor pulses and inert gas purge pulses without an intervening metal precursor pulse.

20. The method of claim 9, wherein each deposition cycle comprises only a single metal precursor pulse.

21. The method of claim 9, wherein each deposition cycle comprises multiple alternating metal precursor pulses and inert gas purge pulses, without an intervening $H_2$ pulse.

22. The method of claim 9, wherein the structure is a partially fabricated three-dimension (3-D) NAND structure comprising sidewalls and a plurality of openings in the sidewalls leading to a plurality of features having a plurality of interior regions fluidically accessible through the openings.

* * * * *